United States Patent
Miyama et al.

(10) Patent No.: US 8,341,469 B2
(45) Date of Patent: Dec. 25, 2012

(54) CONFIGURATION DEVICE FOR CONFIGURING FPGA

(75) Inventors: Kenichi Miyama, Kawasaki (JP);
Noboru Shimizu, Kawasaki (JP);
Hiromitsu Yanaka, Kawasaki (JP);
Toshihisa Kyouno, Kawasaki (JP);
Nobuyuki Kobayashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 948 days.

(21) Appl. No.: 12/318,586

(22) Filed: Dec. 31, 2008

(65) Prior Publication Data
US 2009/0292978 A1   Nov. 26, 2009

(30) Foreign Application Priority Data
May 26, 2008   (JP) .................................. 2008-137123

(51) Int. Cl.
*G01R 31/3193*   (2006.01)
(52) U.S. Cl. ......................... 714/719; 714/807
(58) Field of Classification Search .................. 714/719, 714/807
See application file for complete search history.

(56) References Cited

U.S. PATENT DOCUMENTS

| | | | | |
|---|---|---|---|---|
| 5,705,938 A | * | 1/1998 | Kean | 326/39 |
| 5,844,422 A | * | 12/1998 | Trimberger et al. | 326/38 |
| 6,069,489 A | * | 5/2000 | Iwanczuk et al. | 326/40 |
| 6,102,963 A | * | 8/2000 | Agrawal | 716/117 |
| 6,191,614 B1 | * | 2/2001 | Schultz et al. | 326/41 |
| 6,237,124 B1 | * | 5/2001 | Plants | 714/763 |
| 6,665,766 B1 | * | 12/2003 | Guccione et al. | 710/305 |
| 7,036,059 B1 | * | 4/2006 | Carmichael et al. | 714/725 |
| 7,310,759 B1 | * | 12/2007 | Carmichael et al. | 714/725 |
| 7,350,134 B2 | * | 3/2008 | Goel et al. | 714/764 |
| 2008/0024163 A1 | | 1/2008 | Marui | |

FOREIGN PATENT DOCUMENTS

| | | |
|---|---|---|
| JP | 8-76974 | 3/1996 |
| JP | 2003-44303 | 2/2003 |
| JP | 2007-251329 | 9/2007 |

OTHER PUBLICATIONS

Japanese Office Action issued Sep. 11, 2012 in corresponding Japanese Patent Application No. 2008-137123.

* cited by examiner

*Primary Examiner* — Stephen M Baker
(74) *Attorney, Agent, or Firm* — Staas & Halsey LLP

(57) ABSTRACT

An FPGA configuration device comprises: a read operation control unit which performs control to read configuration data from a configured FPGA; and a configuration data transfer unit which transfers the configuration data read out of the FPGA to a memory.

12 Claims, 26 Drawing Sheets

CONFIGURATION DEVICE FOR CONFIGURING FPGA

This application is based upon and claims the benefit of priority of the prior Japanese Patent Application No. 2008-137123, filed on May 26, 2008, the entire contents of which are incorporated herein by reference.

FIELD

The present invention relates to an FPGA (Field Programmable Gate Array) configuration device for configuring an FPGA, a circuit board on which such an FPGA configuration device is mounted, an electronic device which configures a built-in FPGA by using an FPGA configuration device, and an FPGA configuration method.

BACKGROUND

In recent years, FPGAs whose internal logic circuits are freely programmable have come into wide use. A device equipped with an FPGA incorporates an FPGA configuration circuit which is used to configure the FPGA by loading configuration data stored in a designated memory into the FPGA during power-up, etc. Some of such FPGA-equipped devices are designed to be able to configure the FPGA not only by using the configuration data stored in memory, but also by using an externally connected configuration data writer (hereinafter referred to as the "data writer").

FIG. 1 is a block diagram schematically showing the configuration of an electronic device that can configure a built-in FPGA by using an externally connected data writer. The electronic device 1 includes an FPGA 2, an FPGA configuration device 3, and a memory 4. The FPGA configuration device 3 can configure the FPGA 2 by loading the configuration data stored in the memory 4 into the FPGA 2 during power-up of the electronic device 1, etc. Further, the electronic device 1 is configured so that the FPGA 2 can also be configured using the externally connected data writer 100.

When configuring the FPGA 2 from the data writer 100, the FPGA configuration device 3 stores the configuration data, which the data writer 100 writes to the FPGA 2, as new configuration data into the memory 4 in parallel with the configuration of the FPGA 2. For example, when power is turned on the next time, the FPGA configuration device 3 configures the FPGA 2 by using the newly stored configuration data.

Japanese Laid-open Patent Publication No. 2007-251329 discloses a circuit having a configurable core, a configuration data storage memory, a configuration controller, and a memory controller. Japanese Laid-open Patent Publication No. 8-76974 discloses a technique that stores configuration data in an internal configuration RAM and that downloads the configuration data from the RAM into an FPGA. Japanese Laid-open Patent Publication No. 2003-44303 discloses a technique that stores configuration data in a nonvolatile memory and that loads the configuration data from the nonvolatile memory into an FPGA.

When configuring the FPGA 2 by the data writer 100 externally connected to the electronic device 1, it is required that the data writing speed at which the FPGA configuration device 3 transfers the data to the memory 4 be faster than the data transfer speed at which the data writer 100 transfers the data to the FPGA 2. Accordingly, the configuration of the FPGA configuration device 3 and the device to be used as the memory 4 are chosen so as to satisfy the above requirement, which imposes constraints on the circuit design of the electronic device 1.

SUMMARY

An object of the device and method disclosed herein is to design an electronic device equipped with an FPGA so that the FPGA can be configured using an externally connected data writer, and to resolve the above-described problem that arises when storing the configuration data written from the data writer to the FPGA into a memory.

According to an aspect of the embodiment, an FPGA configuration device comprises: a read operation control unit which performs control to read configuration data from a configured FPGA; and a configuration data transfer unit which transfers the configuration data read out of the FPGA to a memory.

Additional objects and advantages of the embodiment will be set forth in part in the description which follows, and in part will be obvious from the description, or may be learned by practice of the invention. The object and advantages of the invention can be realized and attained by means of the elements and combinations particularly pointed out in the appended claims. It is to be understood that the foregoing general description and the following detailed description are exemplary and explanatory only and are not restrictive of the invention, as claimed.

BRIEF DESCRIPTION OF DRAWINGS

The present invention will be more clearly understood from the description as set below with reference to the accompanying drawings, wherein.

DESCRIPTION OF THE EMBODIMENT(S)

Figure 1:
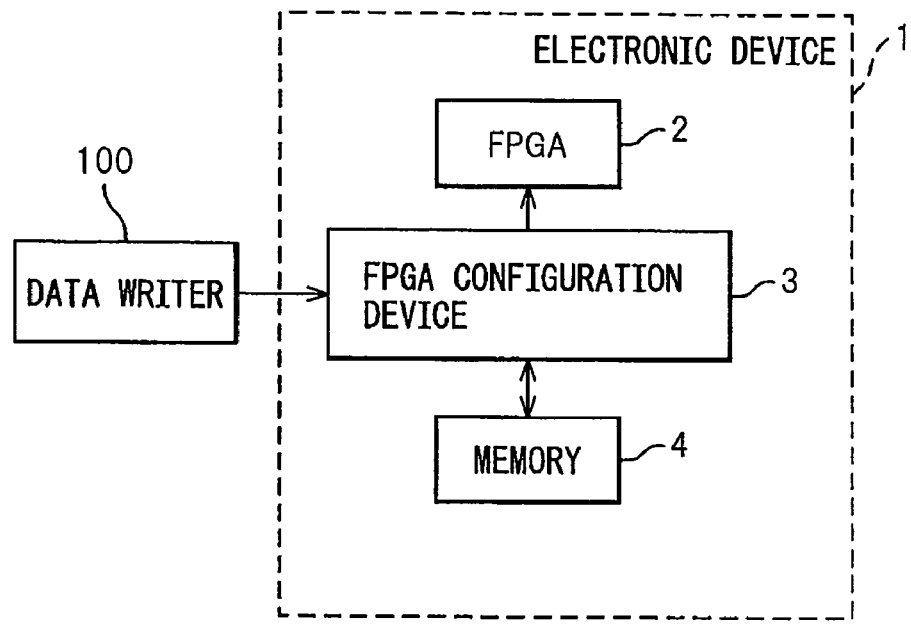
FIG. 1 is a block diagram schematically showing the configuration of an electronic device that can configure a built-in FPGA by using an externally connected data writer.
Figure 2:
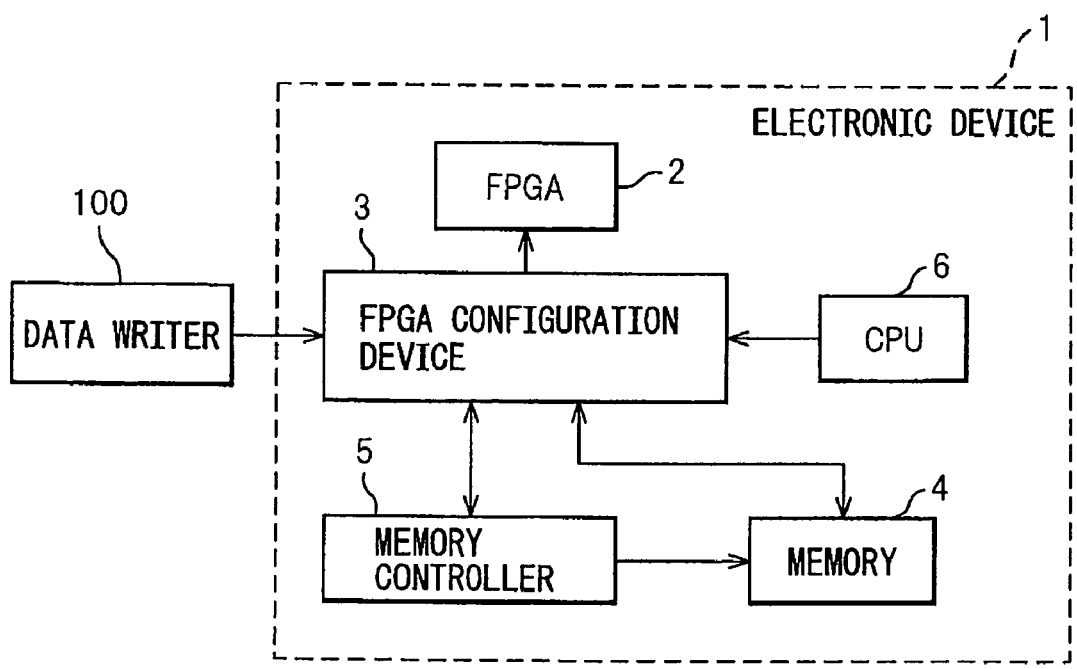
FIG. 2 is a block diagram schematically showing an embodiment of an electronic device disclosed herein.

The embodiments will be described below with reference to the accompanying drawings. FIG. 2 is a block diagram schematically showing an embodiment of an electronic device disclosed herein. The electronic device 1 includes an FPGA 2 which implements the processing to be performed in the electronic device 1, an FPGA configuration device 3 which configures the FPGA 2 when power is turned on to the electronic device 1 or when an externally issued instruction is received, a memory 4 for storing configuration data for the FPGA 2, a memory controller 5 which controls data read/write operations to the memory 4, and a CPU 6 which controls the operation of the FPGA configuration device 3. The memory 4 may be constructed, for example, from a nonvolatile memory such as a flash memory. The electronic device 1 is configured so that the FPGA 2 can also be configured from an externally connected data writer 100. The FPGA configuration device 3 may be mounted on the same circuit board as the FPGA 2 and the memory 4, or on a different circuit board.

Figure 3:
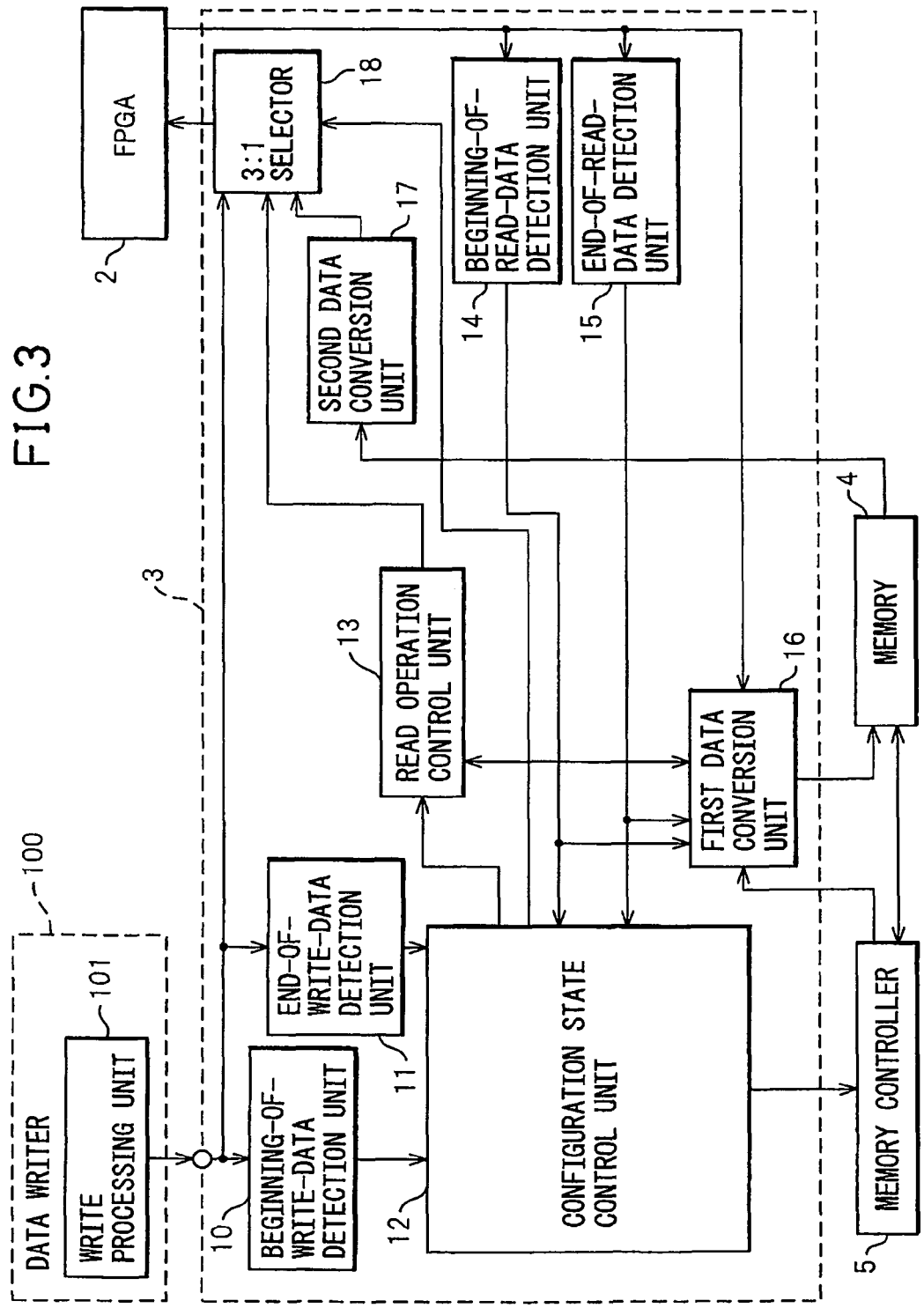
FIG. 3 is a block diagram schematically showing a first configuration example of the FPGA configuration device disclosed herein.

FIG. 3 is a block diagram schematically showing a first configuration example of the FPGA configuration device 3 disclosed herein. For example, when configuring the FPGA 2 by the external data writer 100 at the time of manufacture of the electronic device 1, the data writer 100 is connected to the FPGA configuration device 3, and the configuration data output from the data writer 100 is received by the FPGA configuration device 3.

As shown, the FPGA configuration device 3 includes a beginning-of-write-data detection unit 10, an end-of-write-data detection unit 11, a configuration state control unit 12, a read operation control unit 13, a beginning-of-read-data detection unit 14, an end-of-read-data detection unit 15, a first data conversion unit 16, a second data conversion unit 17, and a 3:1 selector 18.

When configuring the FPGA 2 by the external data writer 100, the beginning-of-write-data detection unit 10 detects the beginning of the configuration data being loaded from the data writer 100, and generates a trigger signal indicating the beginning of the configuration data. The end-of-write-data detection unit 11 detects the end of the configuration data being loaded from the data writer 100, and generates a trigger signal indicating the end of the configuration data.

The configuration state control unit 12 selects the supply source of the configuration data and its write control signal to be output to the FPGA 2, by switching the 3:1 selector 18 according to whether the FPGA 2 is to be configured by the external data writer 100 connected to the FPGA configuration device 3 or by using the configuration data stored in the memory 4. Further, when the end of the configuration data being loaded from the data writer 100 is detected by the end-of-write-data detection unit 11, the configuration state control unit 12 causes the read operation control unit 13 to initiate control to read the configuration data from the FPGA 2, and switches the 3:1 selector 18 so that the control signal from the read operation control unit 13 is supplied to the FPGA 2. Memory controller 5 is then made to initiate processing for writing the thus readout configuration data to the memory 4.

After the configuration of the FPGA 2 by the data writer 100 is completed, the read operation control unit 13 performs control to read the configuration data from the FPGA 2 by generating a read clock signal for reading the configuration data from the FPGA 2. The first data conversion unit 16 converts the configuration data received from the FPGA 2 into a data format suitable for writing to the memory 4, and transfers the thus converted data to the memory 4. The operation for reading the configuration data from the FPGA 2 and the operation for transferring the data to the memory 4, which the read operation control unit 13 and the first data conversion unit 16 respectively perform, are controlled by a flow control signal that the memory controller 5 generates for the data to be written to the memory 4; that is, when the data can be written to the memory 4, the configuration data is transferred to the memory 4, but when the data cannot be written to the memory 4, the transfer operation is aborted. The read control of the configuration data performed based on the flow control signal will be described in detail later.

The beginning-of-read-data detection unit 14 detects the beginning of the configuration data being read out of the FPGA 2 by the read clock signal, and generates a trigger signal indicating the beginning of the configuration data. The end-of-read-data detection unit 15 detects the end of the configuration data being read out of the FPGA 2, and generates a trigger signal indicating the end of the configuration data. When configuring the FPGA 2 by using the configuration data stored in the memory 4, the second data conversion unit 17 converts the configuration data read out of the memory 4 into a data format suitable for writing to the FPGA 2. Under the control of the select signal from the configuration state control unit 12, the 3:1 selector 18 selects the supply source of the configuration data and/or its write control signal to be output to the FPGA 2.

Figure 4:
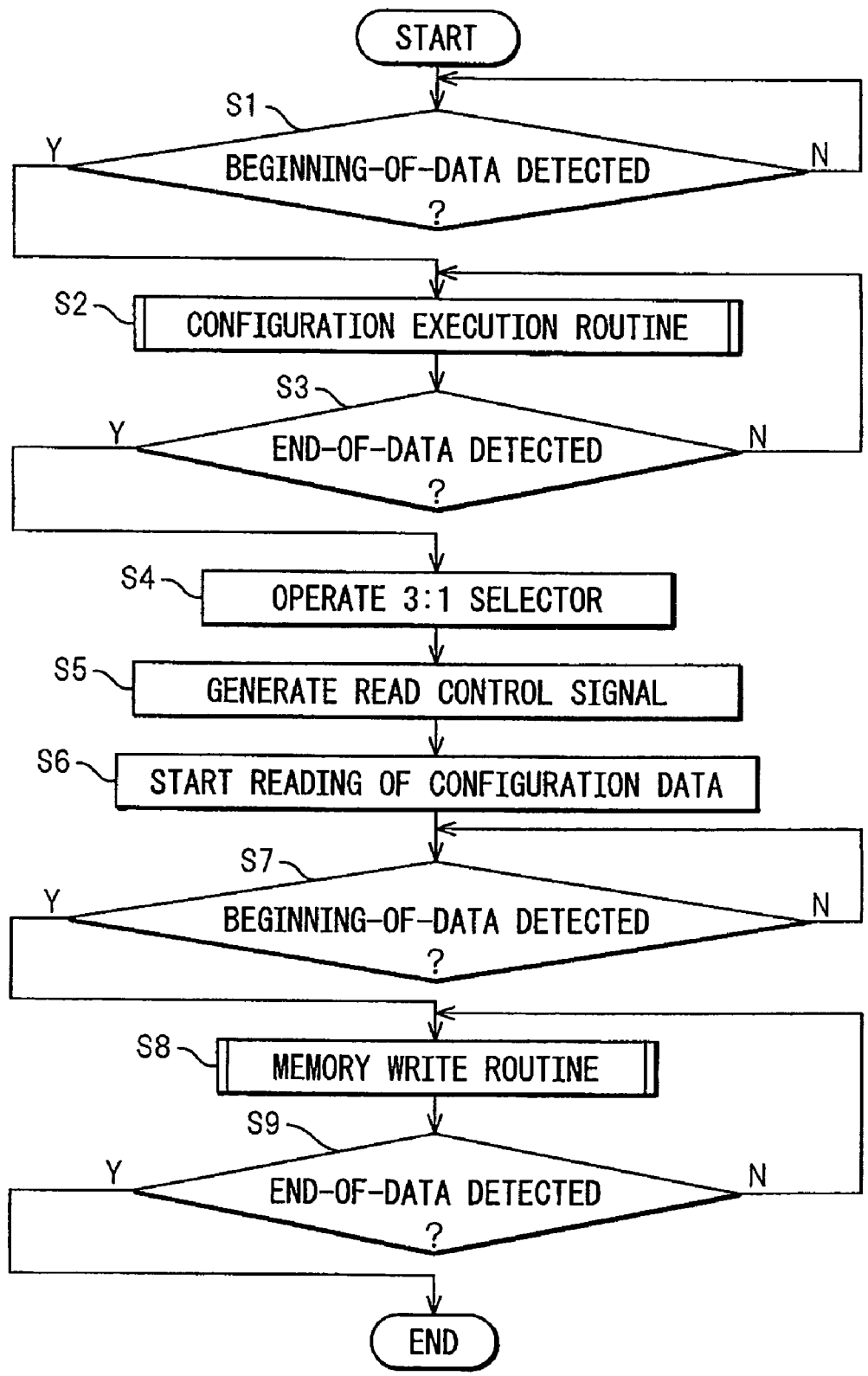
FIG. 4 is a flowchart (part 1) illustrating a configuration method to be used by the FPGA configuration device of FIG. 3.

FIG. 4 is a flowchart (part 1) illustrating a configuration method to be used by the FPGA configuration device 3, FIG.

Figure 6:
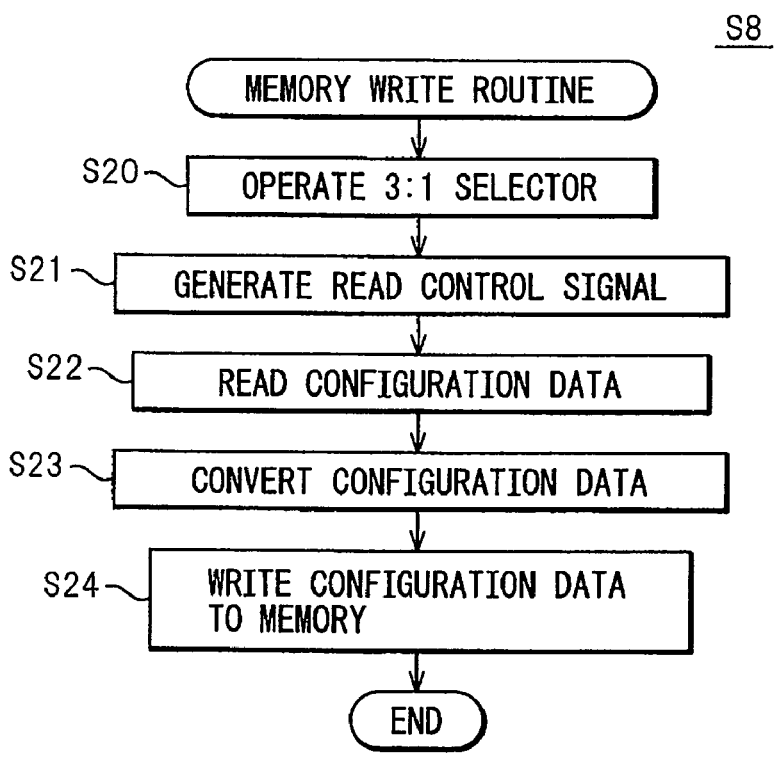
FIG. 6 is a flowchart of a memory write routine shown in FIG. 4.

5 is a flowchart of a configuration execution routine S2 shown in FIG. 4, and FIG. 6 is a flowchart of a memory write routine S8 shown in FIG. 4. According to the configuration method shown in FIG. 4, the data writer 100 is connected to the FPGA configuration device 3, and the FPGA 2 is configured using the data writer 100.

In step S1, when the configuration data and its write control signal transmitted from a write processing unit 101 in the data writer 100 are received by the FPGA configuration device 3, the beginning-of-write-data detection unit 10 detects the beginning of the received configuration data. Based on the timing with which the beginning-of-write-data detection unit 10 detected the configuration data, the configuration state control unit 12 determines the phase of the received configuration data.

In step S2, the configuration of the FPGA 2 is performed using the data writer 100. In step S10 shown in FIG. 5, the configuration state control unit 12, based on the thus determined phase of the configuration data, operates the 3:1 selector 18 so as to select the data writer 100 as the supply source of the configuration data to be output to the FPGA 2. In step S11, the write processing unit 101 in the data writer 100 executes the configuration of the FPGA 2. Step S2 is repeated until the end of the configuration data is detected by the end-of-write-data detection unit 11.

In step S3 in FIG. 4, when the end-of-write-data detection unit 11 detects the end of the configuration data being loaded from the data writer 100, the configuration state control unit 12 determines that the configuration of the FPGA 2 by the data writer 100 is completed, and the process proceeds to step S4. In step S4, the configuration state control unit 12 operates the 3:1 selector 18 so as to select the read operation control unit 13 as the supply source of the control signal to be output to the FPGA 2.

In step S5, the configuration state control unit 12 causes the read operation control unit 13 to generate a read control signal for reading the configuration data from the FPGA 2. The read control signal is supplied via the 3:1 selector 18 to the FPGA 2, thus starting the operation to read the configuration data from the FPGA 2 (S6). In step S7, the beginning-of-read-data detection unit 14 detects the beginning of the configuration data being read out of the FPGA 2.

Based on the timing with which the beginning-of-read-data detection unit 14 detected the configuration data, the configuration state control unit 12 determines the phase of the received configuration data. The configuration state control unit 12 that has determined the phase of the configuration data instructs the first data conversion unit 16 to convert the configuration data read out of the FPGA 2 into a format suitable for writing to the memory 4. Further, the configuration state control unit 12 instructs the memory controller 5 to write the configuration data output from the first data conversion unit 16 into the memory 4.

In step S8, the configuration data read out of the FPGA 2 is stored in the memory 4. In step S20 of FIG. 6, the configuration state control unit 12, based on the thus determined phase of the configuration data, operates the 3:1 selector 18 so as to select the read operation control unit 13 as the supply source of the control signal to be output to the FPGA 2.

In step S21, the configuration state control unit 12 causes the read operation control unit 13 to generate the read control signal for reading the configuration data from the FPGA 2. The read control signal is supplied via the 3:1 selector 18 to the FPGA 2, and in step S22, the configuration data is read out of the FPGA 2. In step S23, the first data conversion unit 16 converts the configuration data read out of the FPGA 2 into a format suitable for writing. In step S24, the first data conversion unit 16 transfers the converted configuration data to the memory 4, and the configuration data is thus stored in the memory 4.

Figure 7:
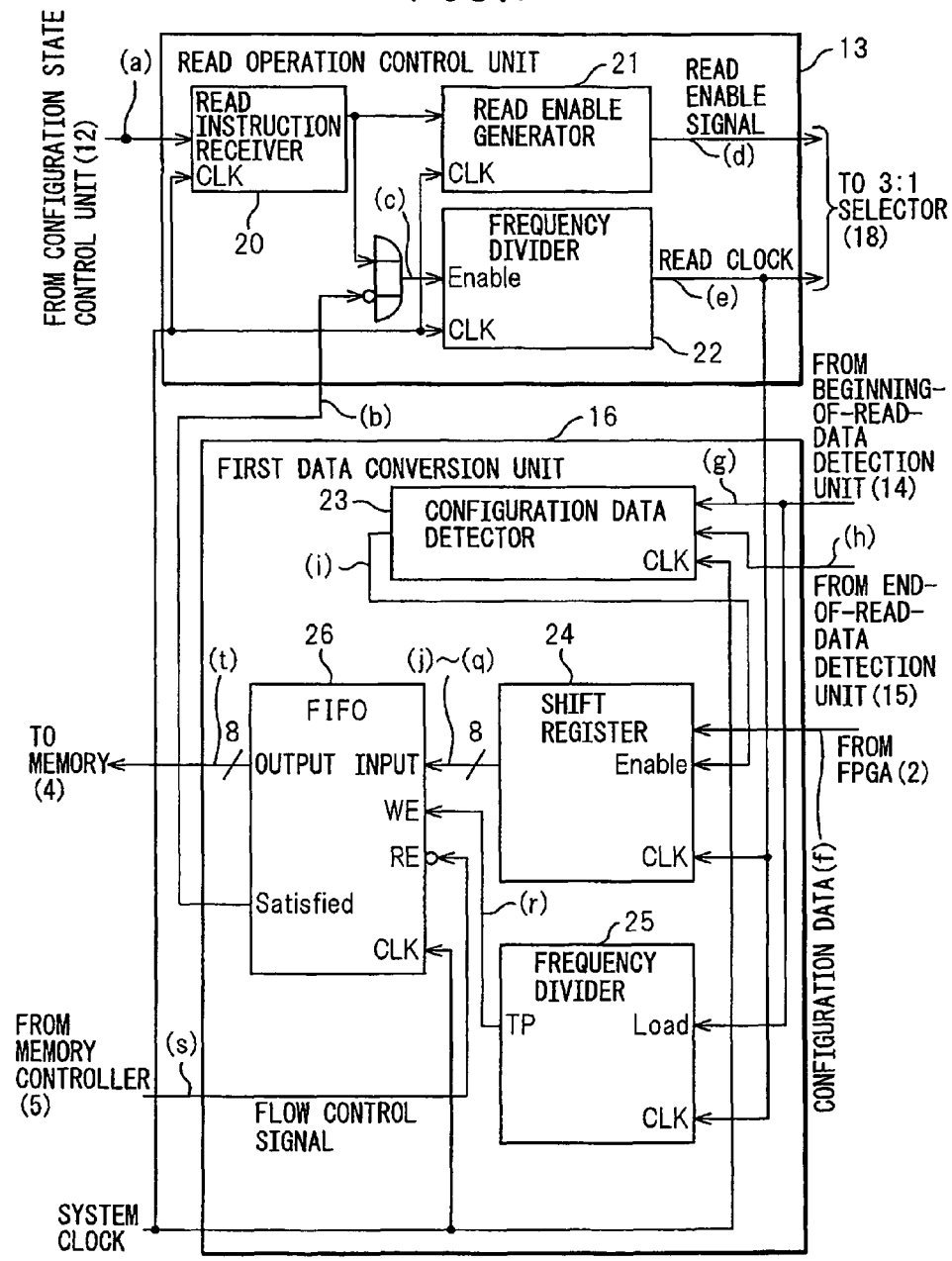
FIG. 7 is a block diagram schematically showing a configuration example of a read operation control unit and a first data conversion unit shown in FIG. 3.

FIG. 7 is a block diagram schematically showing a configuration example of the read operation control unit 13 and the first data conversion unit 16. To enable devices having various data transfer speeds to be made available for use as the memory 4, the read operation control unit 13 and the first data conversion unit 16 read the configuration data from the FPGA 2 and transfer it to the memory 4 in accordance with the flow control that the memory controller 5 performs for the data to be written to the memory 4. As shown, the read operation control unit 13 includes a read instruction receiver 20, a read enable generator 21, and a frequency divider 22. On the other hand, the first data conversion unit 16 includes a configuration data detector 23, a shift register 24, a frequency divider 25, and a FIFO (first-in, first-out) memory 26 (hereinafter abbreviated as FIFO).

The read instruction receiver 20 in the read operation control unit 13 receives from the configuration state control unit 12 a read instruction signal for reading the configuration data from the FPGA 2. The read enable generator 21 supplies the read instruction signal received via the read instruction receiver 20 to the 3:1 selector 18 as a read enable signal to be output to the FPGA 2. A signal produced by logically negating a "Satisfied" signal output from the FIFO 26 in the first data conversion unit 16 is ANDed with the read instruction signal received via the read instruction receiver 20, and the resulting AND signal is applied to the frequency divider 22. The frequency divider 22 generates a clock signal that alternates during the period when the value of the AND signal is "true" and that does not produce edges during the period when the value of the AND signal is "false," and supplies the clock signal to the 3:1 selector 18 as the read clock signal to be output to the FPGA 2. The "Satisfied" signal that the FIFO 26 outputs will be described later.

Based on the detection results from the beginning-of-read-data detection unit 14 and the end-of-read-data detection unit 15, the configuration data detector 23 in the first data conversion unit 16 detects the configuration data being output from the FPGA 2. The shift register 24 latches the configuration data read out of the FPGA 2 and shifts the latched data in accordance with the read clock signal from the frequency divider 22, and thus converts the configuration data from serial to parallel for output to the FIFO 26.

The frequency divider 25 generates a capture timing signal TP for capturing the output data of the shift register 24 into the FIFO 26 by frequency-dividing the read clock signal from the frequency divider 22, and applies it to a write enable terminal WE of the FIFO 26. At this time, the frequency divider 25 determines a boundary between each byte of the configuration data based on the detection timing of the beginning-of-read-data detection unit 14 applied to its load terminal, and outputs the timing signal TP in synchronism with the timing with which signals of bits 1 to 8 contained in each byte of the configuration data are output from the data output buses of the shift register 24.

During the period that the read enable RE is asserted, the FIFO 26 outputs the configuration data at its output terminal in the order in which the data was input at its input terminal. When the read enable RE is asserted by logically negating the flow control signal from the memory controller 5 that inhibits writing to the memory 4, that is, when the data can be written to the memory 4, the configuration data is output from the FIFO 26, but when the data cannot be written to the memory 4, the output of the configuration data is stopped. When all the storage area is used up for reasons such as the data input speed being faster than the data output speed, the FIFO 26 asserts the "Satisfied" signal so that its logic value is "true." As a result, when the storage area of the FIFO 26 becomes full, no edges occur in the read clock signal from the frequency divider 22, thus preventing the FIFO 26 from overflowing.

Figure 8:
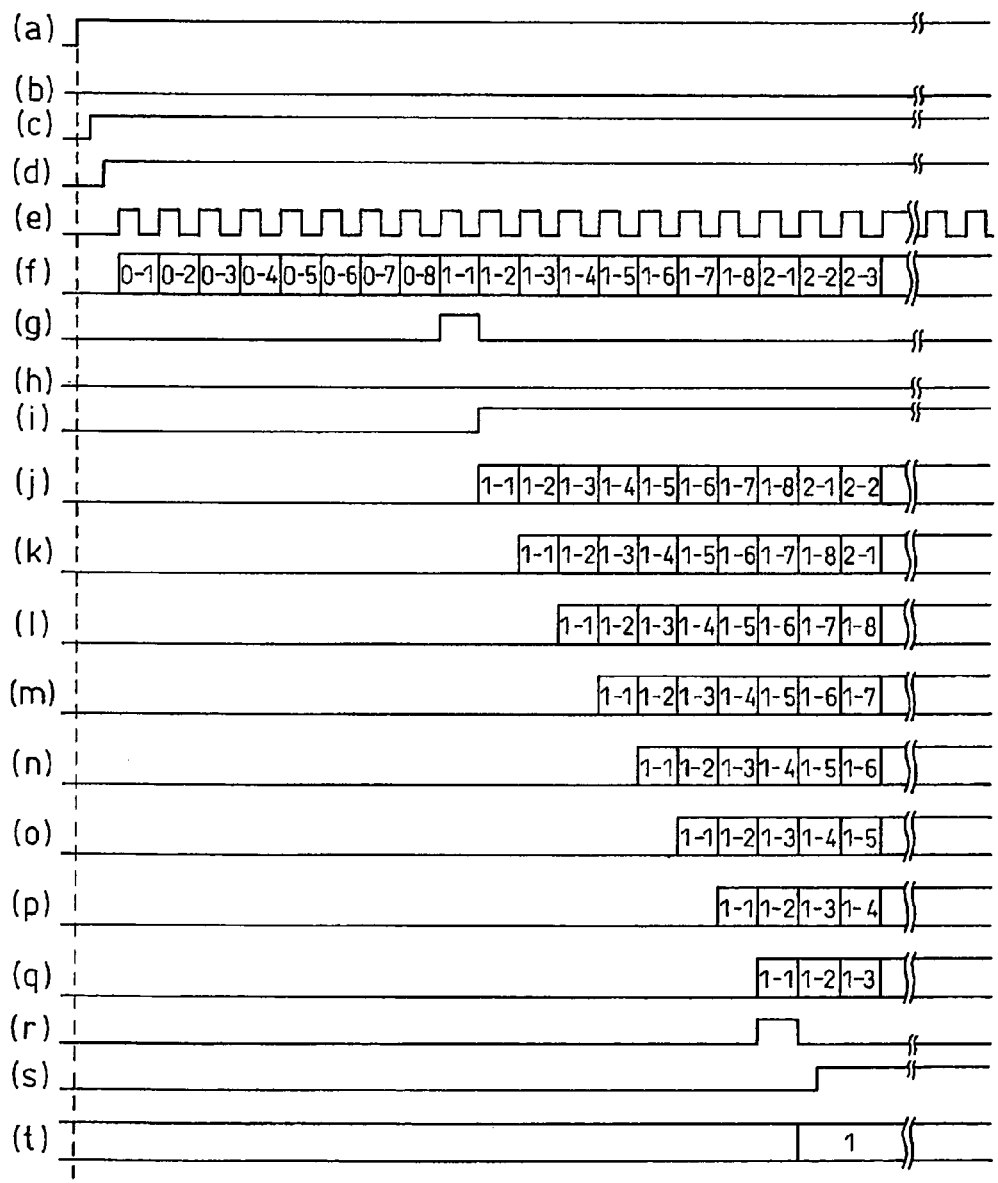
FIG. 8 is a time chart (part 1) of signals at various parts of the circuit of FIG. 7.
Figure 9:
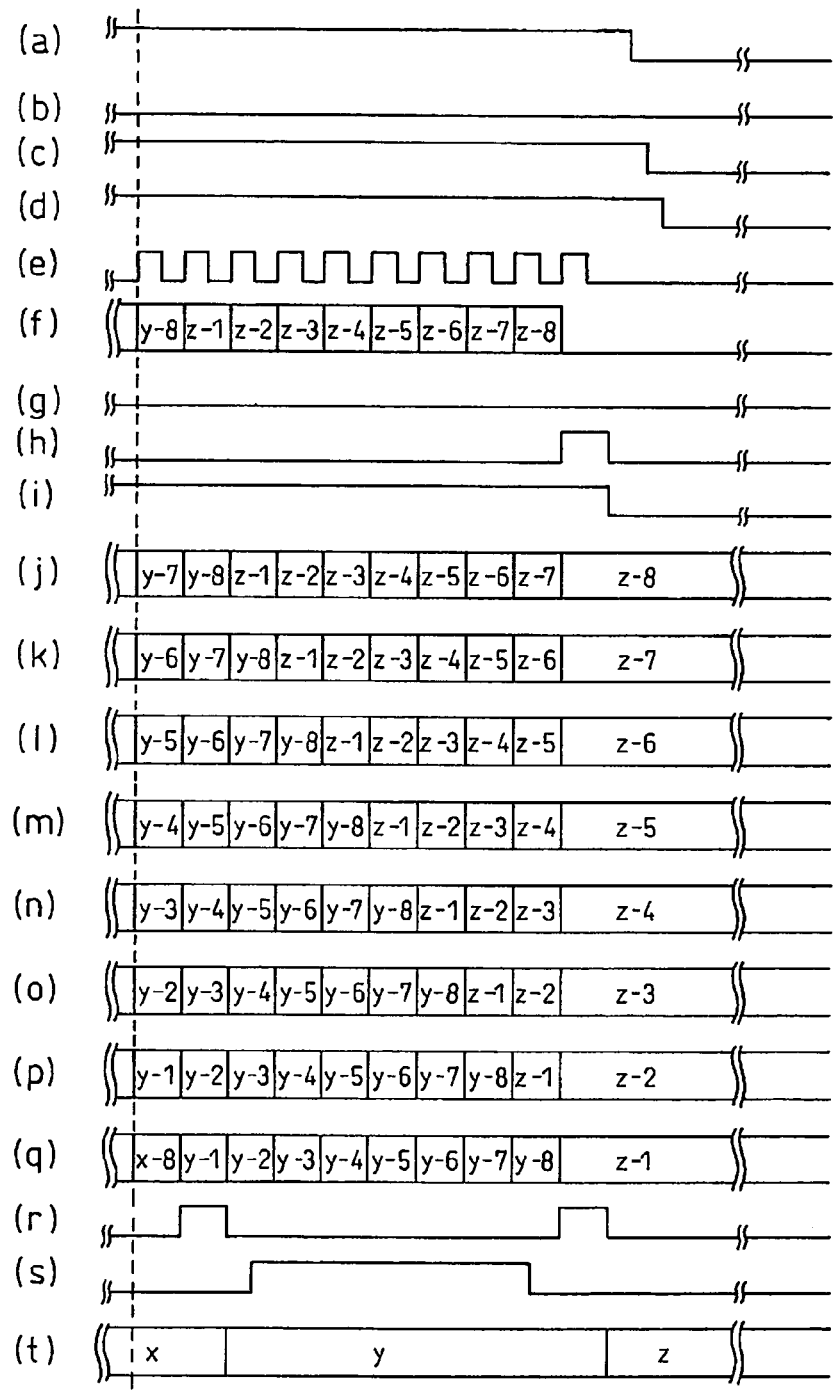
FIG. 9 is a time chart (part 2) of signals at various parts of the circuit of FIG. 7.
Figure 10:
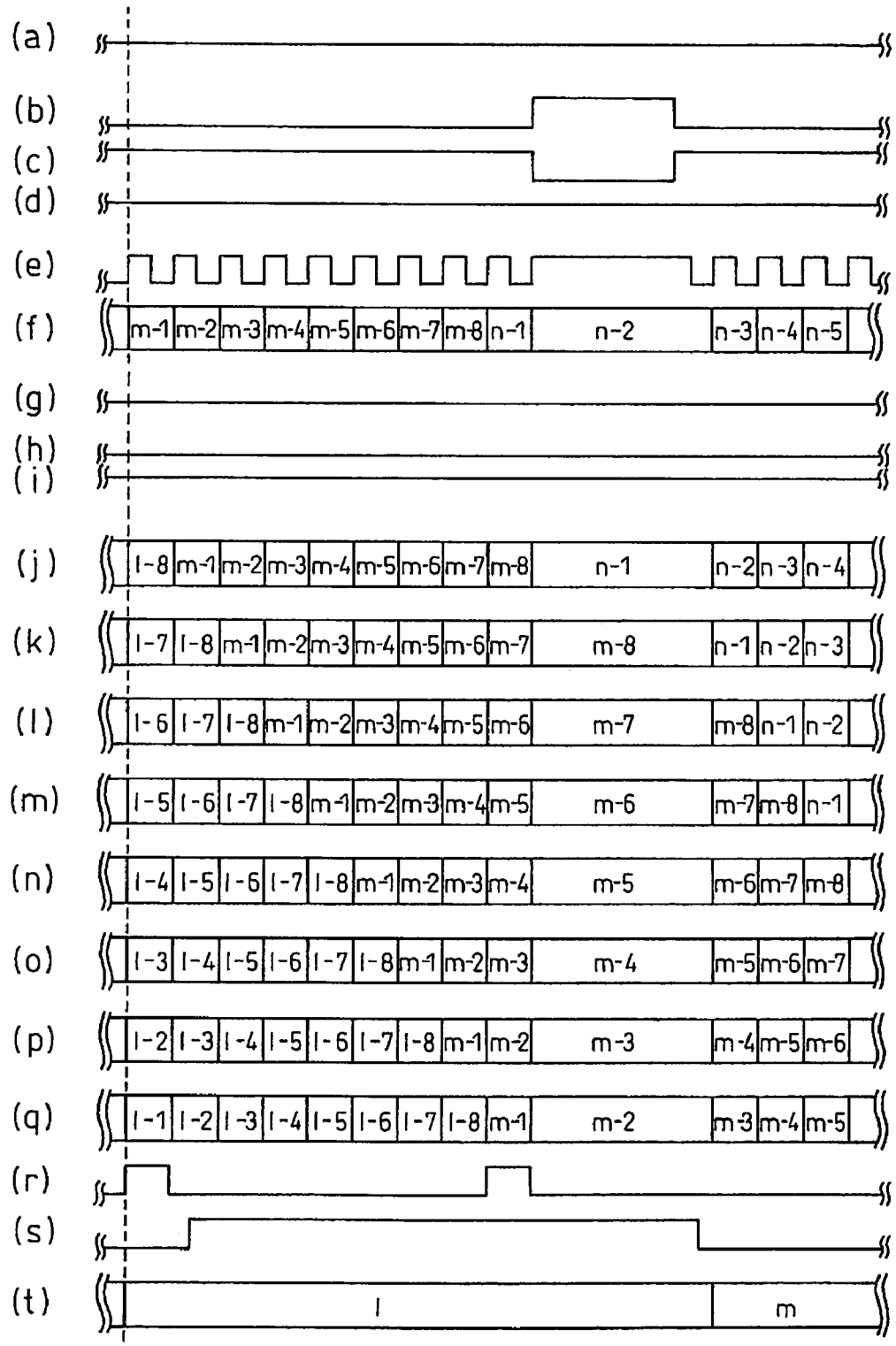
FIG. 10 is a time chart (part 3) of signals at various parts of the circuit of FIG. 7.

FIGS. 8 to 10 are time charts of the signals indicated at (a) to (t) in the circuit of FIG. 7. In FIGS. 8 to 10, the signal (a) is the read instruction signal received at the read instruction receiver 20, the signal (b) is the "Satisfied" signal output from the FIFO 26, the signal (c) is the AND signal applied to the frequency divider 22, the signal (d) is the read enable signal, and the signal (e) is the read clock signal.

Further, the signal (f) is the configuration data in serial form that is read out of the FPGA 2, the signal (g) is the trigger signal output from the beginning-of-read-data detection unit 14, the signal (h) is the trigger signal output from the end-of-read-data detection unit 15, the signal (i) is the output signal of the configuration data detector 23, and the signals (j) to (q) are the signals of 8 bits output from the shift register 24.

The signal (r) is the timing signal TP output from the frequency divider 25, the signal (s) is the flow control signal from the memory controller 5, and the signal (t) is the configuration data in parallel form that is output from the FIFO 26 to the memory 4.

FIG. 8 is a time chart of the signals at the time that the reading of the configuration data is started. As shown, the signals (b) and (h) remain "false". When the configuration of the FPGA 2 by the data writer 100 is completed, and the read instruction signal (a) from the configuration state control unit 12 is asserted, the read enable signal (d) is asserted, whereupon the read clock signal (e) is supplied, thus starting the reading of the configuration data (f) in serial form from the FPGA 2.

When a synchronization byte ("0-1" to "0-8") contained in the configuration data (f) is received, the beginning-of-read-data detection unit 14 outputs the pulse signal (g). The configuration data detector 23 asserts its output logic value (i) to indicate that the reading of the configuration data is in progress.

The shift register 24 is enabled by the output logic value (i) of the configuration data detector 23, and outputs the bit signals (j) to (q) by converting the configuration data (f) from serial to parallel. Based on the pulse timing of the trigger signal (g) applied from the beginning-of-read-data detection unit 14 to the load terminal, the frequency divider 25 outputs the timing signal TP (r) in synchronism with the timing with which the signals of bits 1 to 8 ("1-1" to "1-8) contained in the first byte of the configuration data are output from the data output buses (j) to (q) of the shift register 24. When the configuration data converted to the parallel data (t) is output from the FIFO 26, the flow control signal (s) is asserted until the data becomes ready to be written to the memory 4, and during that period, the data read from the FIFO 26 is prohibited.

FIG. 9 is a time chart of the signals at the time that the reading of the configuration data is completed. As shown, the signals (b) and (g) remain "false". When the last byte ("z-1" to z-8") in the configuration data (f) is detected, the end-of-read-data detection unit 15 outputs the pulse signal (h). The configuration data detector 23 deasserts its output logic value (i), thus indicating that the reading of the configuration data is completed. The read instruction signal (a) from the configuration state control unit 12 is also deasserted by the pulse signal (h) output from the end-of-read-data detection unit 15, whereupon the read enable signal (d) is deasserted, and the supply of the read clock signal (e) is stopped, thus stopping the reading of the configuration data (f).

FIG. 10 is a time chart of the signals at the time that the "Satisfied" signal of the FIFO 26 is asserted during the reading of the configuration data. As shown, the signals (a), (d), and (i) remain "true," while on the other hand, the signals (g) and (h) remain "false." When the "Satisfied" signal (b) of the FIFO 26 is asserted, since the logic value of the input (c) to the frequency divider 22 becomes "false," the read clock signal (e) stops alternating, whereupon the reading of the configuration data (f) being read in synchronism with an edge of the read clock signal (e) stops. Further, the shift register 24 stops the latching and shifting of the configuration data upon ceasing of the read clock signal (e), and as a result, the bit signals (j) to (q) are held in the register 24.

In step S9 of FIG. 4, the end-of-read-data detection unit 15 detects the end of the configuration data being read out of the FPGA 2. The configuration state control unit 12 determines that the reading of the configuration data from the FPGA 2 is completed, and thus terminates the process.

In the configuration shown in FIG. 3, the first data conversion unit 16 takes as inputs the detection signals from the beginning-of-read-data detection unit 14 and the end-of-read-data detection unit 15, but instead of the detection signals from the beginning-of-read-data detection unit 14 and the end-of-read-data detection unit 15, other signals may be input to the first data conversion unit 16, as long as such other signals can be used to identify the phase and end of the configuration data being read out of the FPGA 2. For example, signals that can be used to identify the phase and end of the configuration data may be supplied from the configuration state control unit 12. This also applies to other embodiments described herein. Further, the detection signal from the end-of-read-data detection unit 15 is input to the first data conversion unit 16, but if the data end position can be determined without having to detect the end of the configuration data, such as when the length of the configuration data is known in advance, the end-of-read-data detection unit 15 may be omitted. This also applies to other embodiments described herein.

Similarly, the detection signals from the end-of-write-data detection unit 11 and the end-of-read-data detection unit 15 are input to the configuration state control unit 12, but if the data end position can be determined without having to detect the end of the configuration data, such as when the length of the configuration data is known in advance, the end-of-write-data detection unit 11 and the end-of-read-data detection unit 15 may be omitted. This also applies to other embodiments described herein.

Further, the "Satisfied" signal of the FIFO 26 in the first data conversion unit 16 is supplied to the read operation control unit 13 to control the generation of the read clock signal and the stopping of the generation, but instead of the "Satisfied" signal, the flow control signal generated by the memory controller 5 may be used to control the generation of the read clock signal and the stopping of the generation, or a signal similar to the "Satisfied" signal or the flow control signal generated by the memory controller 5 may be generated by the configuration state control unit 12 and supplied accordingly. This also applies to other embodiments described herein.

Figure 11:
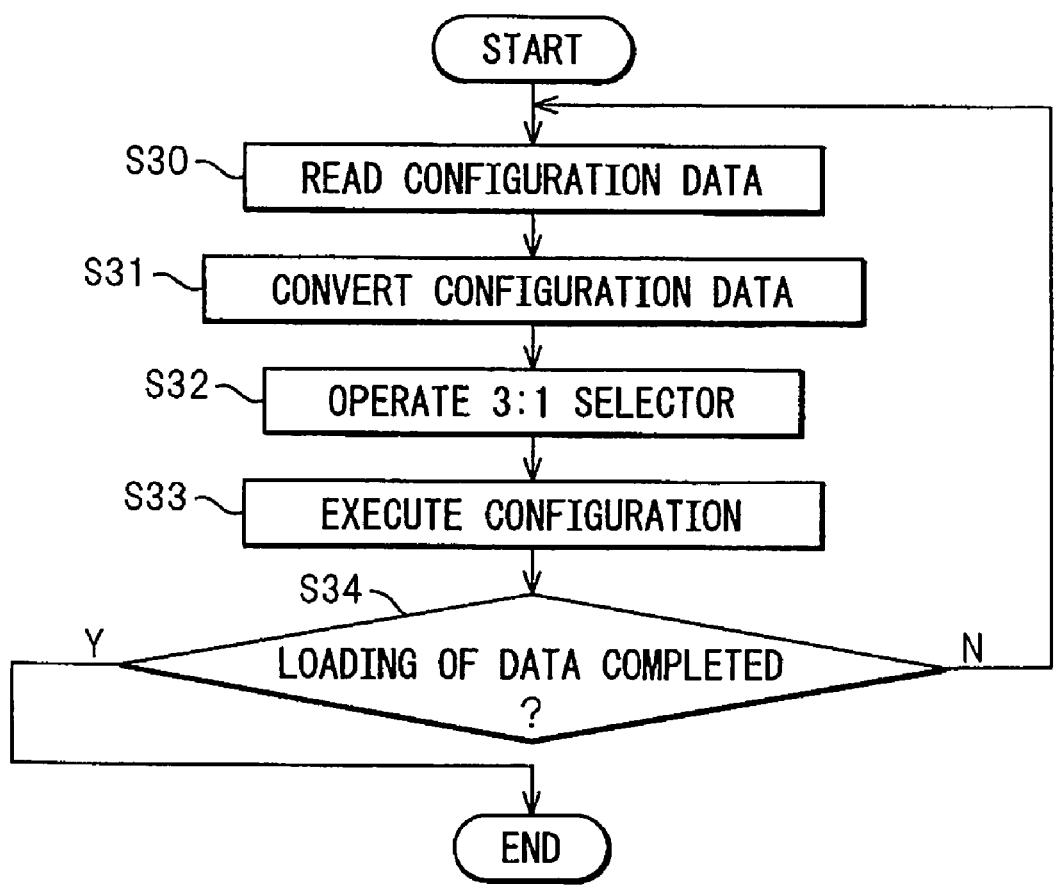
FIG. 11 is a flowchart (part 2) illustrating a configuration method to be used by the FPGA configuration device of FIG. 3.

In the configuration shown in FIG. 3, the beginning-of-write-data detection unit 10 and the beginning-of-read-data detection unit 14 are provided separately, and the end-of-write-data detection unit 11 and the end-of-read-data detection unit 15 are also provided separately, but since these detection units are provided to detect the beginning and end of the same configuration data, the beginning-of-write-data detection unit 10 and the beginning-of-read-data detection unit 14 may be combined and implemented on the same circuit, and the end-of-write-data detection unit 11 and the end-of-read-data detection unit 15 may also be combined and implemented on the same circuit. This also applies to other embodiments described herein FIG. 11 is a flowchart (part 2) illustrating a configuration method to be used by the FPGA configuration device 3 of FIG. 3. In the configuration method shown in FIG. 11, the data writer 100 is not connected to the FPGA configuration device 3, and the FPGA configuration device 3 performs the configuration of the FPGA 2 by using the configuration data stored in the memory 4.

When power is turned on to the electronic device 1, or when an externally issued instruction is received, the configuration state control unit 12 in step S30 causes the memory controller 5 to perform control to read the configuration data from the memory 4. In step S31, the second data conversion unit 17 converts the configuration data read out of the memory 4 into a data format that can be written to the FPGA 2, and generates a write control signal for writing the thus converted configuration data to the FPGA 2.

In step S32, the configuration state control unit 12 operates the 3:1 selector 18 so as to select the second data conversion unit 17 as the supply source of the configuration data and its write control signal to be output to the FPGA 2. In step S33, the configuration data and the write control signal are output to the FPGA 2 to execute the configuration. The above steps S30 to S33 are repeated until the loading of the configuration data stored in the memory 4 is completed.

Figure 12:
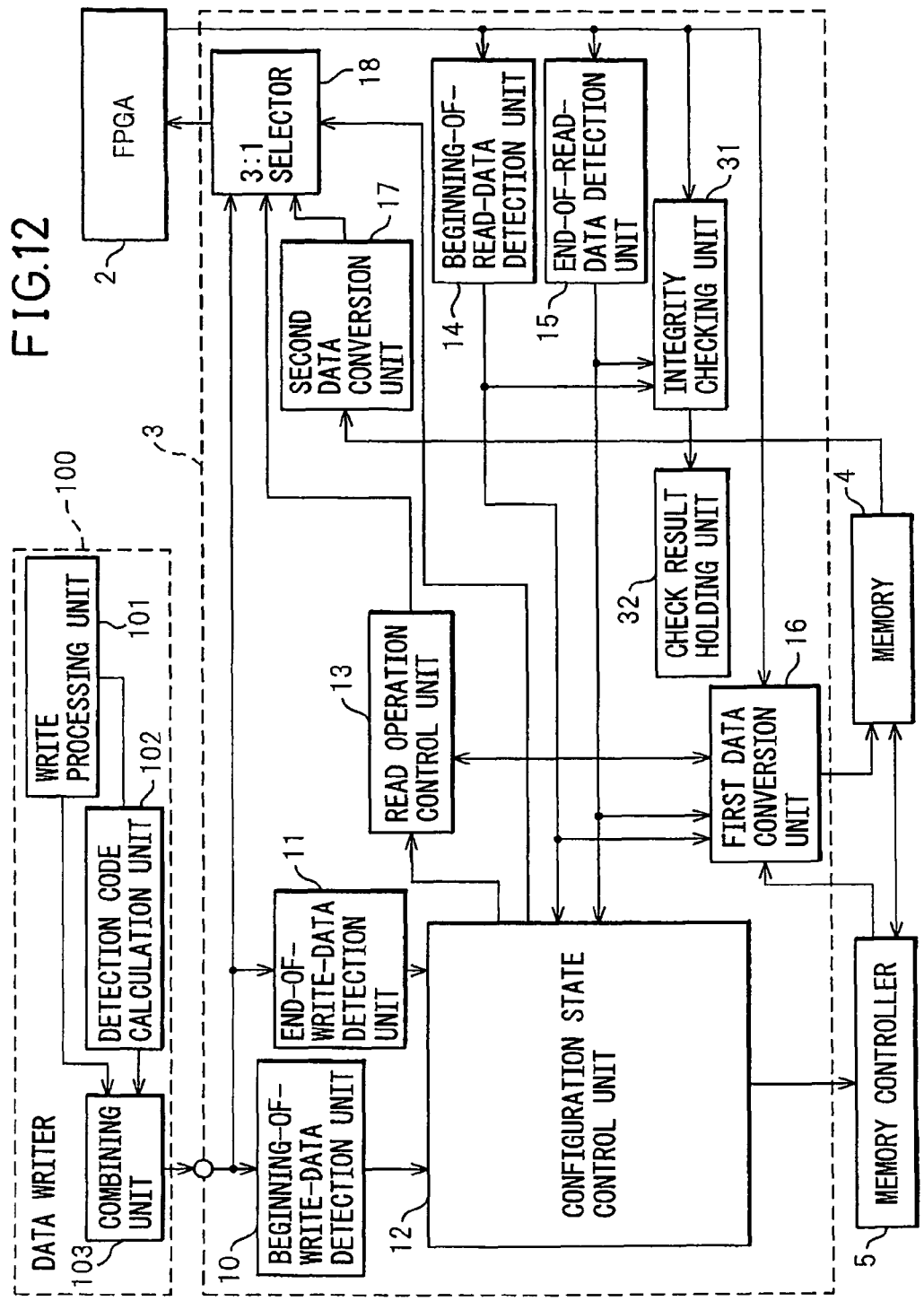
FIG. 12 is a block diagram schematically showing a second configuration example of the FPGA configuration device disclosed herein.

FIG. 12 is a block diagram schematically showing a second configuration example of the FPGA configuration device 3 disclosed herein. The FPGA configuration device 3 shown in FIG. 12 is similar in configuration to the FPGA configuration device 3 described with reference to FIG. 3, and the same component elements are designated by the same reference numerals and will not be described further herein. In this configuration example, the FPGA configuration device 3 includes an integrity checking unit 31 which checks the integrity of the configuration data read out of the FPGA 2, and a check result holding unit 32 which holds the result of the check performed by the integrity checking unit 31.

The integrity checking unit 31 identifies, based on the detection results from the beginning-of-read-data detection unit 14 and the end-of-read-data detection unit 15, the beginning and end of the configuration data read out of the FPGA 2, calculates an error detection code for the configuration data, and compares it with the error detection code contained in the configuration data read out of the FPGA 2, thereby checking the integrity of the configuration data read out of the FPGA 2. The error detection code may be, for example, a parity code or a cyclic redundancy checking (CRC) code. This also applies to other embodiments described herein. In the data writer 100, a detection code calculation unit 102 calculates an error detection code for the configuration data that the write processing unit 101 outputs, and a combining unit 103 combines the error detection code with the configuration data for output to the FPGA configuration device 3.

When the integrity of the configuration data read out of the FPGA 2 and held in the memory 4 is verified by the integrity check result held in the check result holding unit 32, the CPU 6 in FIG. 2, which controls the operation of the FPGA configuration device 3, allows the FPGA configuration device 3 to perform the configuration using that configuration data; on the other hand, if the configuration data has failed the integrity check, the CPU 6 may disallow the FPGA configuration device 3 to perform the configuration using that configuration data. This also applies to other embodiments having the check result holding unit 32 described herein.

Figure 13:
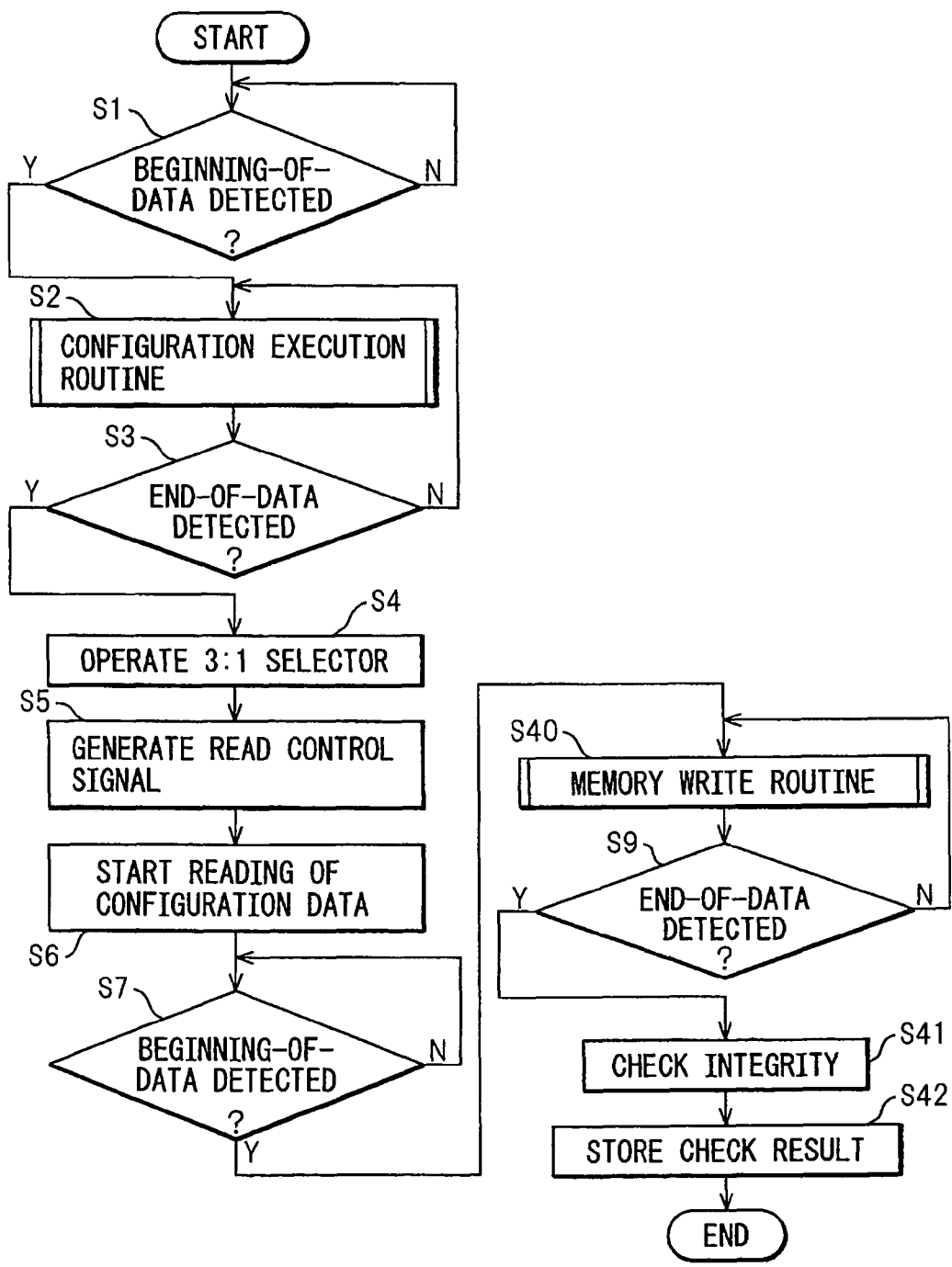
FIG. 13 is a flowchart illustrating a configuration method to be used by the FPGA configuration device of FIG. 12.
Figure 14:
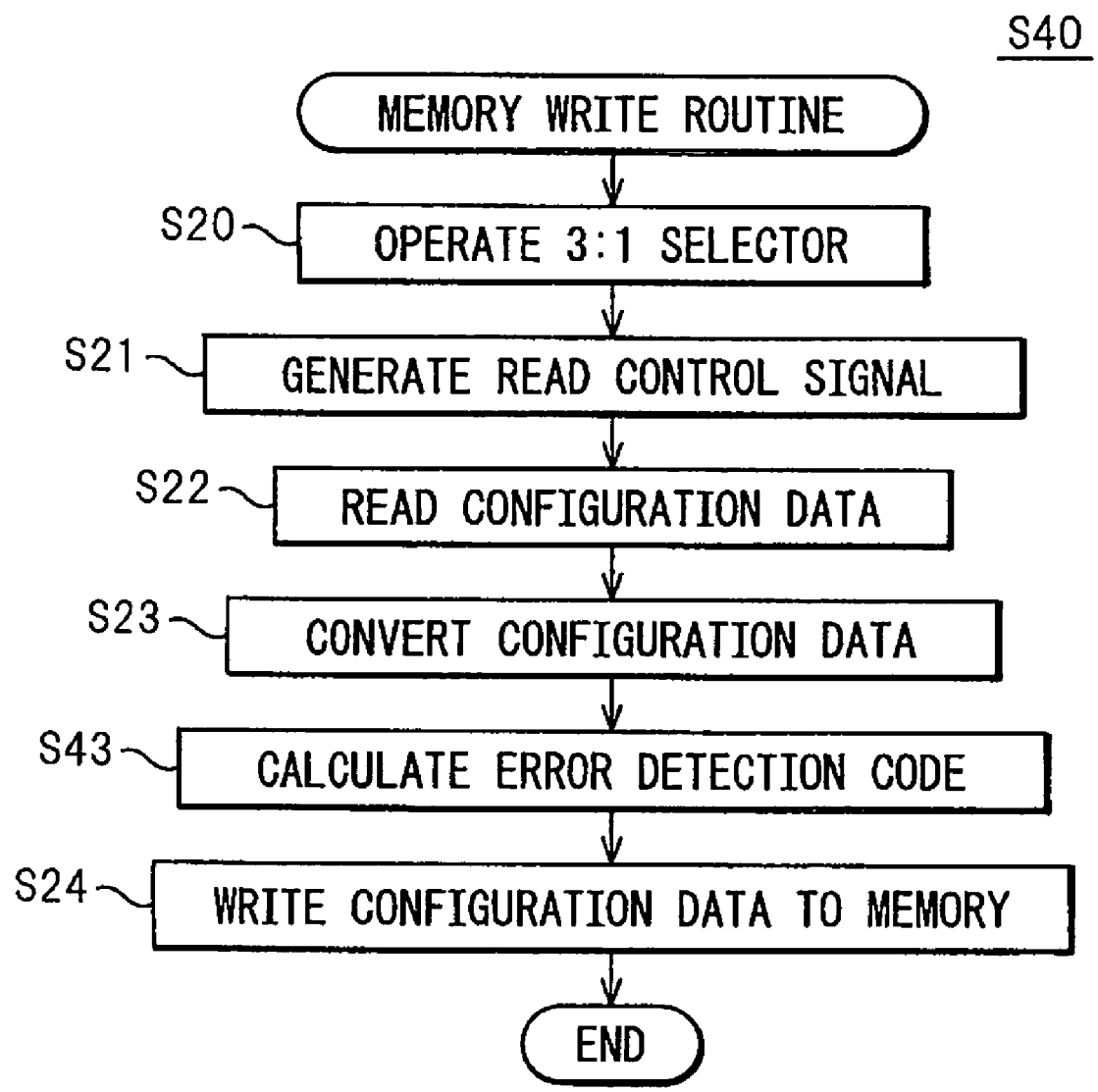
FIG. 14 is a flowchart of a memory write routine shown in FIG. 13.

FIG. 13 is a flowchart illustrating a configuration method to be used by the FPGA configuration device 3 of FIG. 12, and FIG. 14 is a flowchart of a memory write routine S40 shown in FIG. 13.

In steps S1 to S3, the configuration of the FPGA 2 is performed in the same manner as in steps S1 to S3 shown in FIG. 4. In steps S4 to S7, the reading of the configuration data from the FPGA 2 is started, and the beginning of the configuration data is detected, as in steps S4 to S7 shown in FIG. 4. Thereafter, the process proceeds to the memory write routine S40 shown in FIG. 14.

In steps S20 to S23, the configuration data is read out of the FPGA 2 and converted into a format suitable for writing to the memory 4, as in steps S20 to S23 shown in FIG. 6. In the subsequent step S43, the integrity checking unit 31 calculates the error detection code for the configuration data read out of the FPGA 2. In step S24, the first data conversion unit 16 transfers the converted configuration data to the memory 4, and the configuration data is thus stored in the memory 4.

In step S9 shown in FIG. 13, the end-of-read-data detection unit 15 detects the end of the configuration data being read out of the FPGA 2. When the end of the configuration data is detected, the process proceeds to step S41; otherwise, the process returns to step S40 to repeat the above processing. In step S41, the integrity checking unit 31 checks the integrity of the configuration data read out of the FPGA 2 by comparing the calculated error detection code with the error detection code contained in the configuration data read out of the FPGA 2. In step S42, the integrity checking unit 31 stores the result of the check in the check result holding unit 32.

In the configuration shown in FIG. 12, the integrity checking unit 31 takes as inputs the detection signals from the beginning-of-read-data detection unit 14 and the end-of-read-data detection unit 15, but instead of the detection signals from the beginning-of-read-data detection unit 14 and the end-of-read-data detection unit 15, other signals may be input to the integrity checking unit 31, as long as such other signals can be used to identify the phase and end of the configuration data being read out of the FPGA 2. For example, signals that can be used to identify the phase and end of the configuration data may be supplied from the configuration state control unit 12. This also applies to other embodiments described herein. Further, the detection signal from the end-of-read-data detection unit 15 is input to the integrity checking unit 31, but if the data end position can be determined without having to detect the end of the configuration data, such as when the length of the configuration data is known in advance, the end-of-read-data detection unit 15 may be omitted. This also applies to other embodiments described herein.

Figure 15:
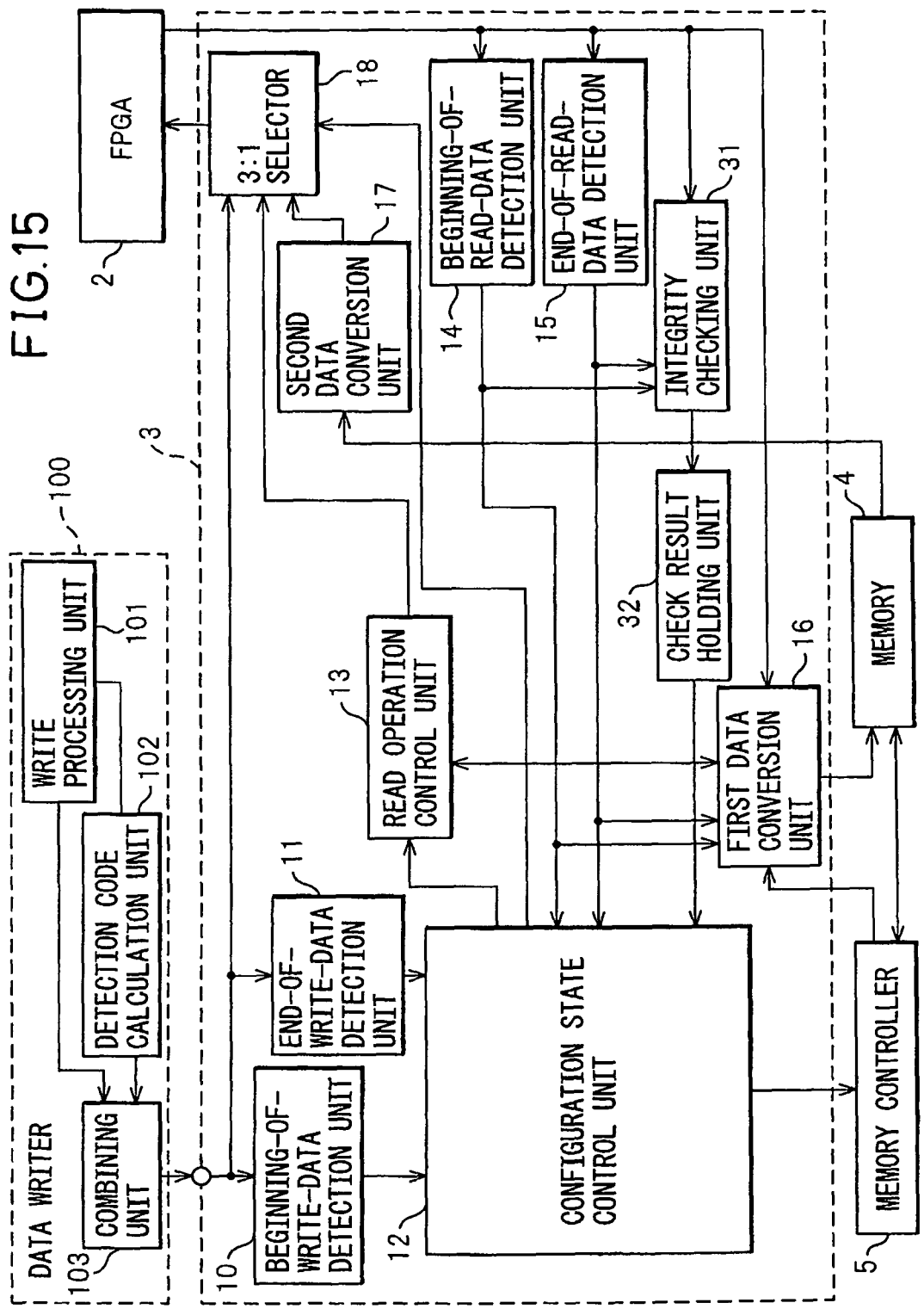
FIG. 15 is a block diagram schematically showing a third configuration example of the FPGA configuration device disclosed herein.

FIG. 15 is a block diagram schematically showing a third configuration example of the FPGA configuration device 3 disclosed herein. The FPGA configuration device 3 shown in FIG. 15 is similar in configuration to the FPGA configuration device 3 described with reference to FIG. 12, and the same component elements are designated by the same reference numerals and will not be described further herein. In this configuration example, if the check result supplied from the integrity checking unit 31 and held in the check result holding unit 32 shows that the configuration data stored in the memory 4 has failed the integrity check, the configuration state control unit 12 performs processing for invalidating that configuration data.

Figure 16:
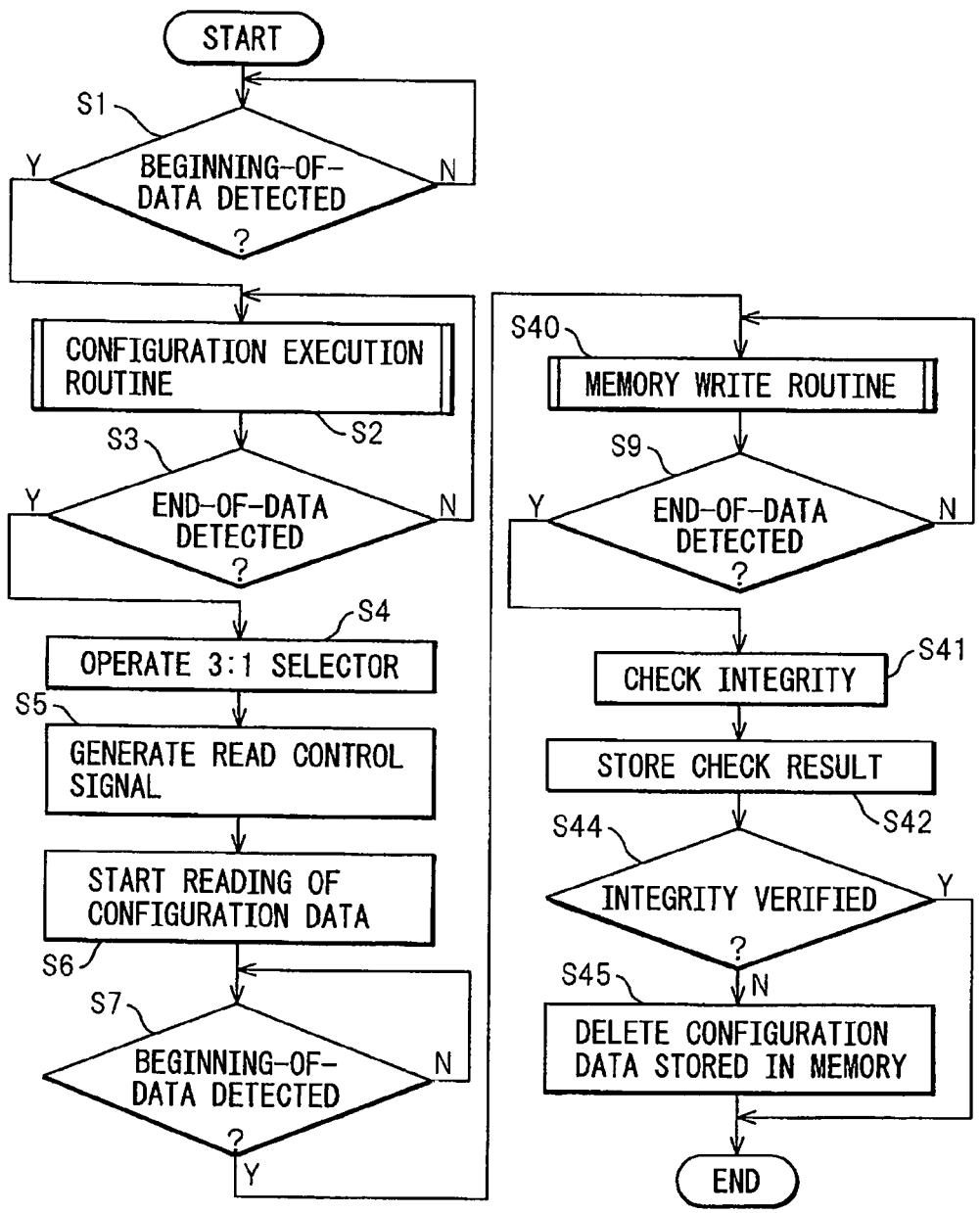
FIG. 16 is a flowchart (part 1) illustrating a configuration method to be used by the FPGA configuration device of FIG. 15.

The processing for invalidating the configuration data stored in the memory 4 includes processing for deleting the configuration data stored in the memory 4. FIG. 16 is a flowchart illustrating a configuration method to be used by the FPGA configuration device 3 of FIG. 15. The process from step S1 to step S42 is the same as the process from step S1 to step S42 described with reference to FIG. 13, and therefore, will not be described further herein. In step S44, the configuration state control unit 12 determines whether the integrity of the configuration data stored in the memory 4 has been verified or not, by referring to the result of the check performed by the integrity checking unit 31 and held in the check result holding unit 32. If the integrity is verified, the process is terminated, but if not, the configuration data stored in the memory 4 is deleted in step S45.

The processing for invalidating the configuration data stored in the memory 4 includes processing in which the configuration state control unit 12 refers to the check result holding unit 32, or stores the contents of the check result held in the check result holding unit 32 into a flip-flop provided in the configuration state control unit 12, and prohibits the configuration of the FPGA 2 from being performed using the configuration data stored in the memory 4. This also applies to the fourth and fifth configuration examples of the FPGA configuration device 3 to be described later.

Figure 17:
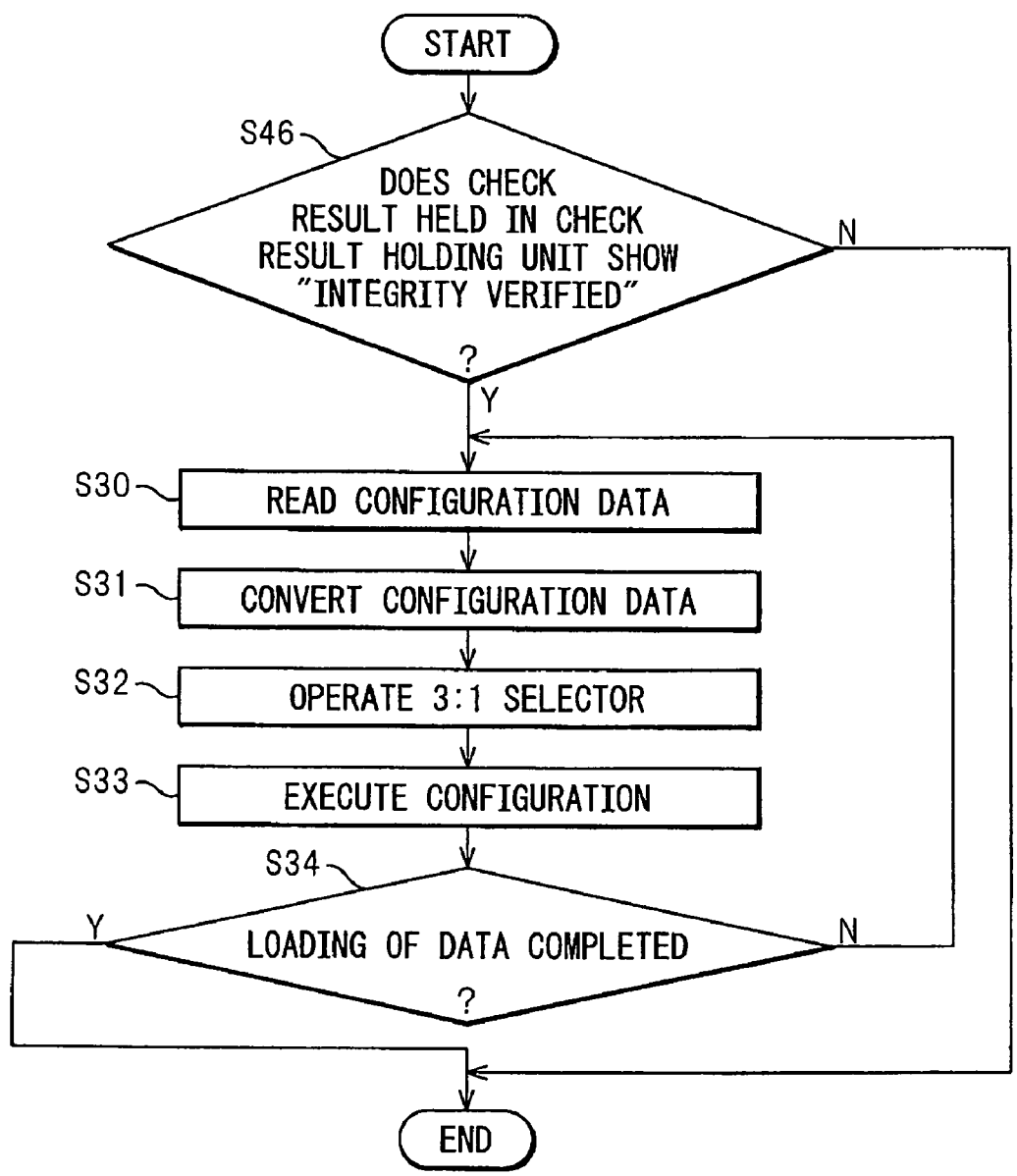
FIG. 17 is a flowchart (part 2) illustrating a configuration method to be used by the FPGA configuration device of FIG. 15.

FIG. 17 is a flowchart illustrating the configuration method that prohibits the configuration depending on the result of the integrity check. In the configuration method shown in FIG. 17, the data writer 100 is not connected to the FPGA configuration device 3, and the FPGA configuration device 3 performs the configuration of the FPGA 2 by using the configuration data stored in the memory 4.

When power is turned on to the electronic device 1, or when an externally issued instruction is received, the configuration state control unit 12 in step S46 refers to the check result holding unit 32, or to the result of the check performed by the integrity checking unit 31 and held in the flip-flop provided in the configuration state control unit 12, and determines whether the integrity of the configuration data stored in the memory 4 has been verified or not. If the integrity is verified, the configuration of the FPGA 2 is performed in the same manner as in steps S30 to S34 described with reference to FIG. 11, but if not, the process is terminated by aborting the configuration of the FPGA 2.

Figure 18:
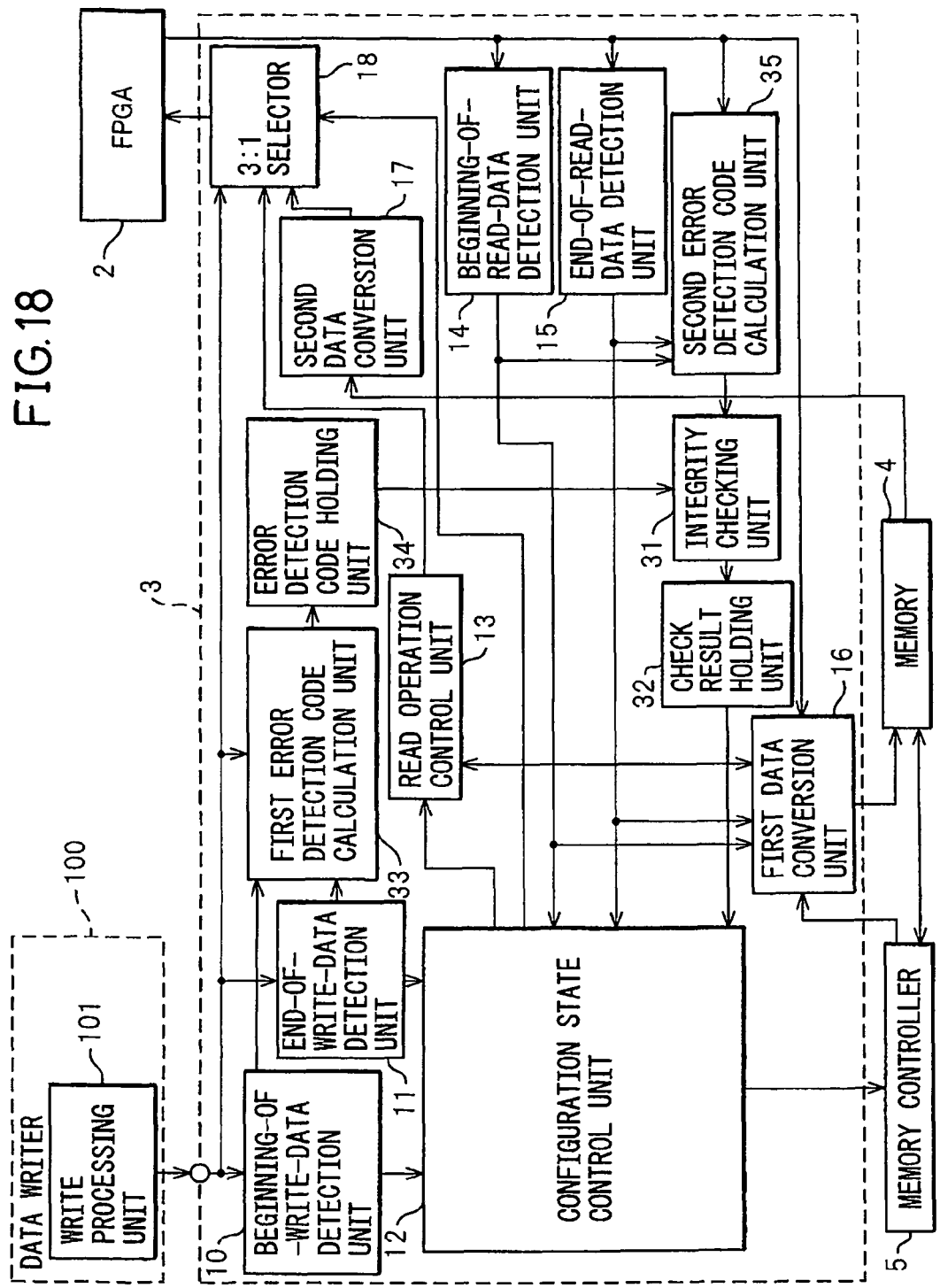
FIG. 18 is a block diagram schematically showing a fourth configuration example of the FPGA configuration device disclosed herein.

FIG. 18 is a block diagram schematically showing the fourth configuration example of the FPGA configuration device 3 disclosed herein. The FPGA configuration device 3 shown in FIG. 18 is similar in configuration to the FPGA configuration device 3 described with reference to FIG. 3, and the same component elements are designated by the same reference numerals and will not be described further herein.

In this configuration example, the FPGA configuration device 3 includes a first error detection code calculation unit 33 which calculates an error detection code for the configuration data loaded from the data writer 100 when configuring the FPGA 2 by using the external data writer 100, an error detection code holding unit 34 which holds the error detection code calculated by the first error detection code calculation unit 33, a second error detection code calculation unit 35 which calculates an error detection code for the configuration data read out of the FPGA 2, an integrity checking unit 31 which checks the integrity of the configuration data read out of the FPGA 2 by comparing the error detection code held in the error detection code holding unit 34 with the error detection code calculated by the second error detection code calculation unit 35, and a check result holding unit 32 which holds the result of the check performed by the integrity checking unit 31.

The first error detection code calculation unit 33 identifies, based on the detection results supplied from the beginning-of-write-data detection unit 10 and the end-of-write-data detection unit 11, the beginning and end of the configuration data being loaded from the data writer 100, and calculates the error detection code for the configuration data. The second error detection code calculation unit 35 identifies, based on the detection results supplied from the beginning-of-read-data detection unit 14 and the end-of-read-data detection unit 15, the beginning and end of the configuration data being read out of the FPGA 2, and calculates the error detection code for the configuration data. If the error detection code held in the error detection code holding unit 34, for example, matches the error detection code calculated by the second error detection code calculation unit 35, the integrity checking unit 31 determines that the integrity of the configuration data read out of the FPGA 2 has been verified, but if these error detection codes do not match, the integrity checking unit 31 determines that the configuration data has failed the integrity check.

Figure 19:
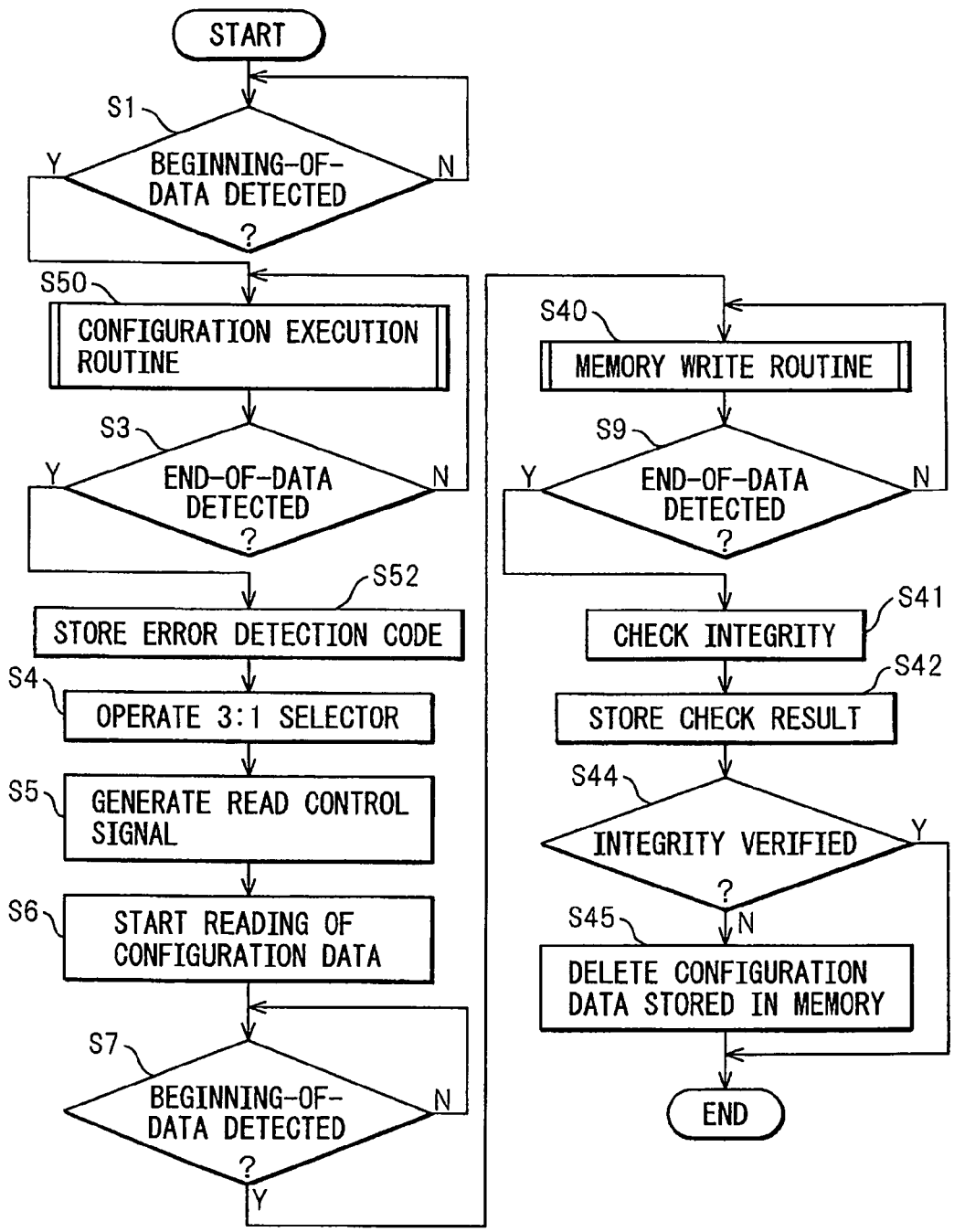
FIG. 19 is a flowchart illustrating a configuration method to be used by the FPGA configuration device of FIG. 18.
Figure 20:
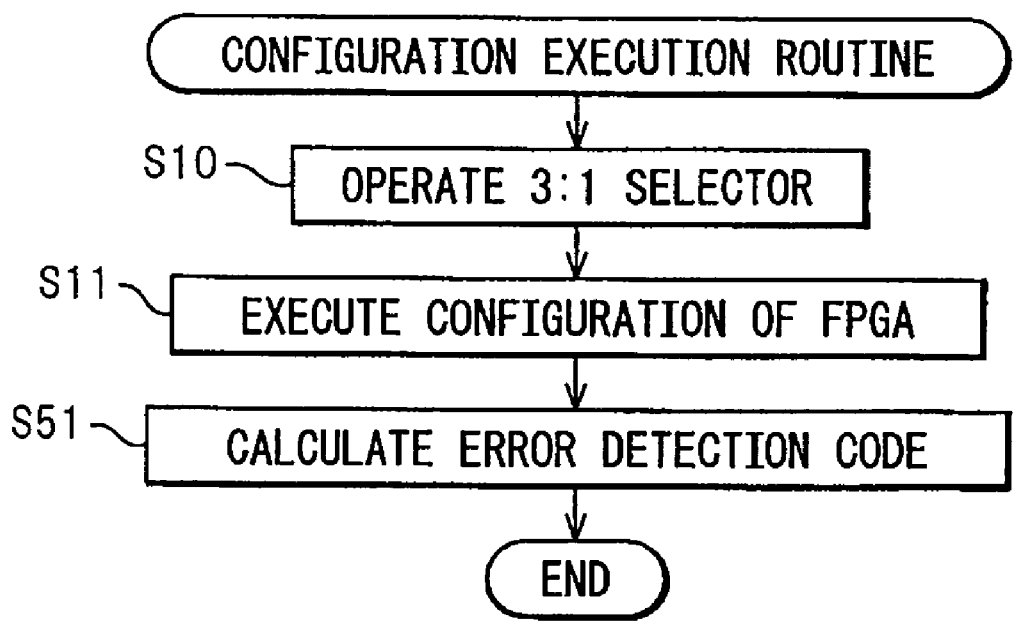
FIG. 20 is a flowchart of a configuration execution routine shown in FIG. 19.

FIG. 19 is a flowchart illustrating a configuration method to be used by the FPGA configuration device 3 of FIG. 18, and FIG. 20 is a flowchart of a configuration execution routine S50 shown in FIG. 19. In step S1, as in step S1 shown in FIG. 4, the beginning of the configuration data being loaded from the data writer 100 is detected, and the phase of the configuration data is determined. After that, in steps S10 and S11 of FIG. 20, the 3:1 selector 18 is operated, and the configuration of the FPGA 2 is executed, as in steps S10 and S11 shown in FIG. 5. In step S51, the first error detection code calculation unit 33 calculates the error detection code for the configuration data.

When, in step S3 shown in FIG. 19, the end-of-write-data detection unit 11 detects the end of the configuration data being loaded from the data writer 100, the error detection code calculated by the first error detection code calculation unit 33 is stored into the error detection code holding unit 34 (step S52). In steps S4 to S9, the configuration data is stored in the memory 4 in the same manner as in steps S4 to S9 shown in FIG. 16. However, in the configuration method illustrated here, the error detection code calculation in step S43 shown in FIG. 14 is performed by the second error detection code calculation unit 35.

In steps S41 to S45, as in steps S41 to S45 shown in FIG. 16, the integrity of the configuration data stored in the memory 4 is checked, and if the configuration data fails the integrity check, processing is performed to invalidate the configuration data. However, in step S41 shown here, if the error detection code held in the error detection code holding unit 34 matches the error detection code calculated by the second error detection code calculation unit 35, the integrity checking unit 31 determines that the integrity of the configuration data read out of the FPGA 2 has been verified, but if these error detection codes do not match, the integrity checking unit 31 determines that the configuration data has failed the integrity check.

In the configuration shown in FIG. 18, the first error detection code calculation unit 33 takes as inputs the detection signals from the beginning-of-write-data detection unit 10 and the end-of-write-data detection unit 11, but instead of the detection signals from the beginning-of-write-data detection unit 10 and the end-of-write-data detection unit 11, other signals may be input to the first error detection code calculation unit 33, as long as such other signals can be used to identify the phase and end of the configuration data being loaded from the data writer 100. For example, signals that can be used to identify the phase and end of the configuration data may be supplied from the configuration state control unit 12.

This also applies to other embodiments described herein. Further, the detection signal from the end-of-write-data detection unit 11 is input to the first error detection code calculation unit 33, but if the data end position can be determined without having to detect the end of the configuration data, such as when the length of the configuration data is known in advance, the end-of-write-data detection unit 11 may be omitted. This also applies to other embodiments described herein.

The second error detection code calculation unit 35 takes as inputs the detection signals from the beginning-of-read-data detection unit 14 and the end-of-read-data detection unit 15, but instead of the detection signals from the beginning-of-read-data detection unit 14 and the end-of-read-data detection unit 15, other signals may be input to the second error detection code calculation unit 35, as long as such other signals can be used to identify the phase and end of the configuration data being read out of the FPGA 2. For example, signals that can be used to identify the phase and end of the configuration data may be supplied from the configuration state control unit 12. This also applies to other embodiments described herein. Further, the detection signal from the end-of-read-data detection unit 15 is input to the second error detection code calculation unit 35, but if the data end position can be determined without having to detect the end of the configuration data, such as when the length of the configuration data is known in advance, the end-of-read-data detection unit 15 may be omitted. This also applies to other embodiments described herein.

Figure 21:
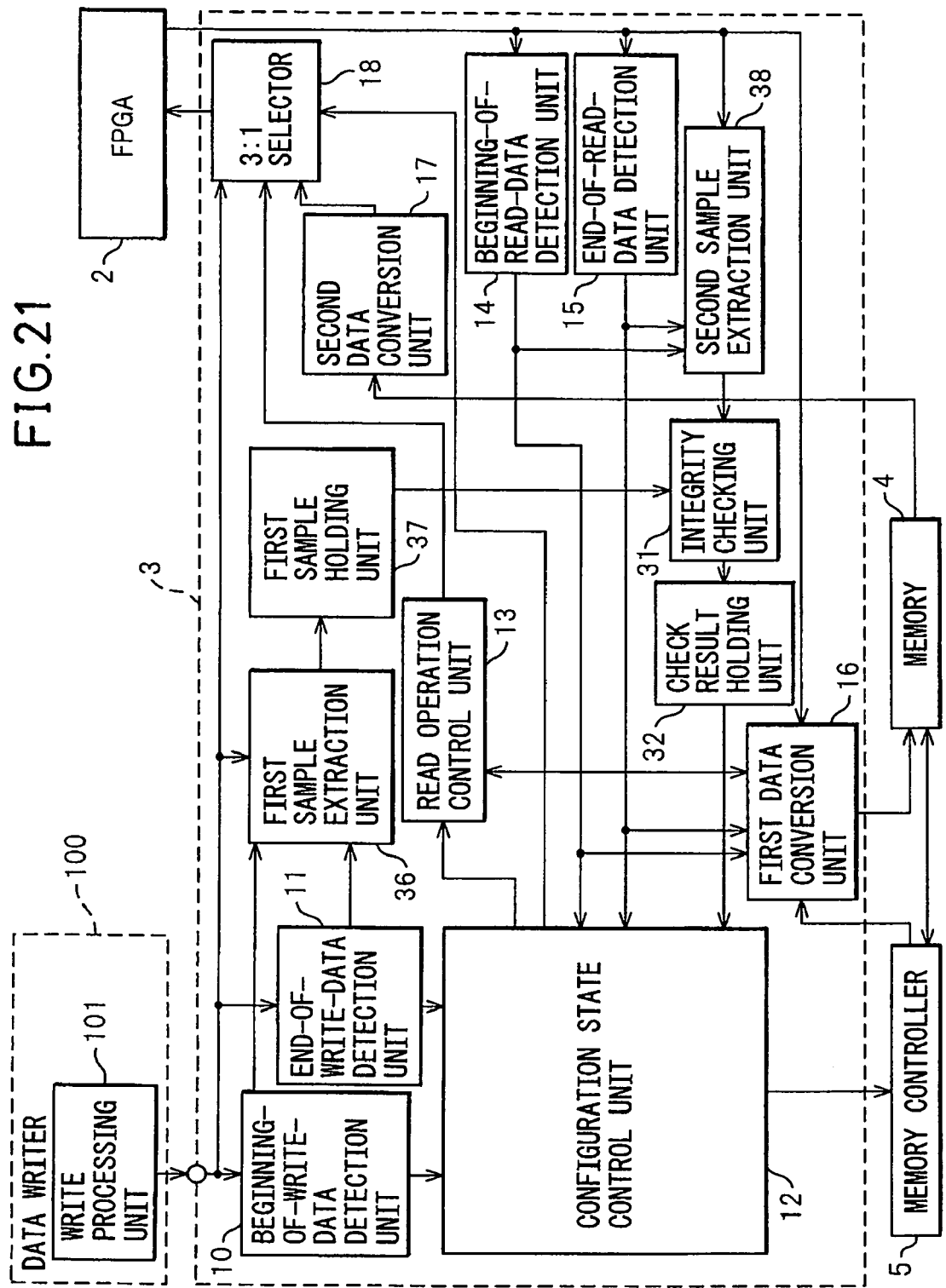
FIG. 21 is a block diagram schematically showing a fifth configuration example of the FPGA configuration device disclosed herein.

FIG. 21 is a block diagram schematically showing the fifth configuration example of the FPGA configuration device 3 disclosed herein. The FPGA configuration device 3 shown in FIG. 21 is similar in configuration to the FPGA configuration device 3 described with reference to FIG. 3, and the same component elements are designated by the same reference numerals and will not be described further herein.

In this configuration example, the FPGA configuration device 3 includes a first sample extraction unit 36 which extracts as a sample a portion of the configuration data being loaded from the data writer 100 when configuring the FPGA 2 by using the external data writer 100, a first sample holding unit 37 which holds the sample extracted by the first sample extraction unit 36, a second sample extraction unit 38 which extracts as a sample a portion of the configuration data being read out of the FPGA 2, an integrity checking unit 31 which checks the integrity of the configuration data read out of the FPGA 2 by comparing the sample held in the first sample holding unit 37 with the sample extracted by the second sample extraction unit 38, and a check result holding unit 32 which holds the result of the check performed by the integrity checking unit 31.

The first sample extraction unit 36 identifies, based on the detection results supplied from the beginning-of-write-data detection unit 10 and the end-of-write-data detection unit 11, the beginning and end of the configuration data being loaded from the data writer 100, and extracts as a sample the data located at a designated position in the configuration data. The second sample extraction unit 38 identifies, based on the detection results supplied from the beginning-of-read-data detection unit 14 and the end-of-read-data detection unit 15, the beginning and end of the configuration data being read out of the FPGA 2, and extracts as a sample the data located at a designated position in the configuration data. If the sample held in the first sample holding unit 37, for example, matches the sample extracted by the second sample extraction unit 38, the integrity checking unit 31 determines that the integrity of the configuration data read out of the FPGA 2 has been verified, but if these samples do not match, the integrity checking unit 31 determines that the configuration data has failed the integrity check.

Figure 22:
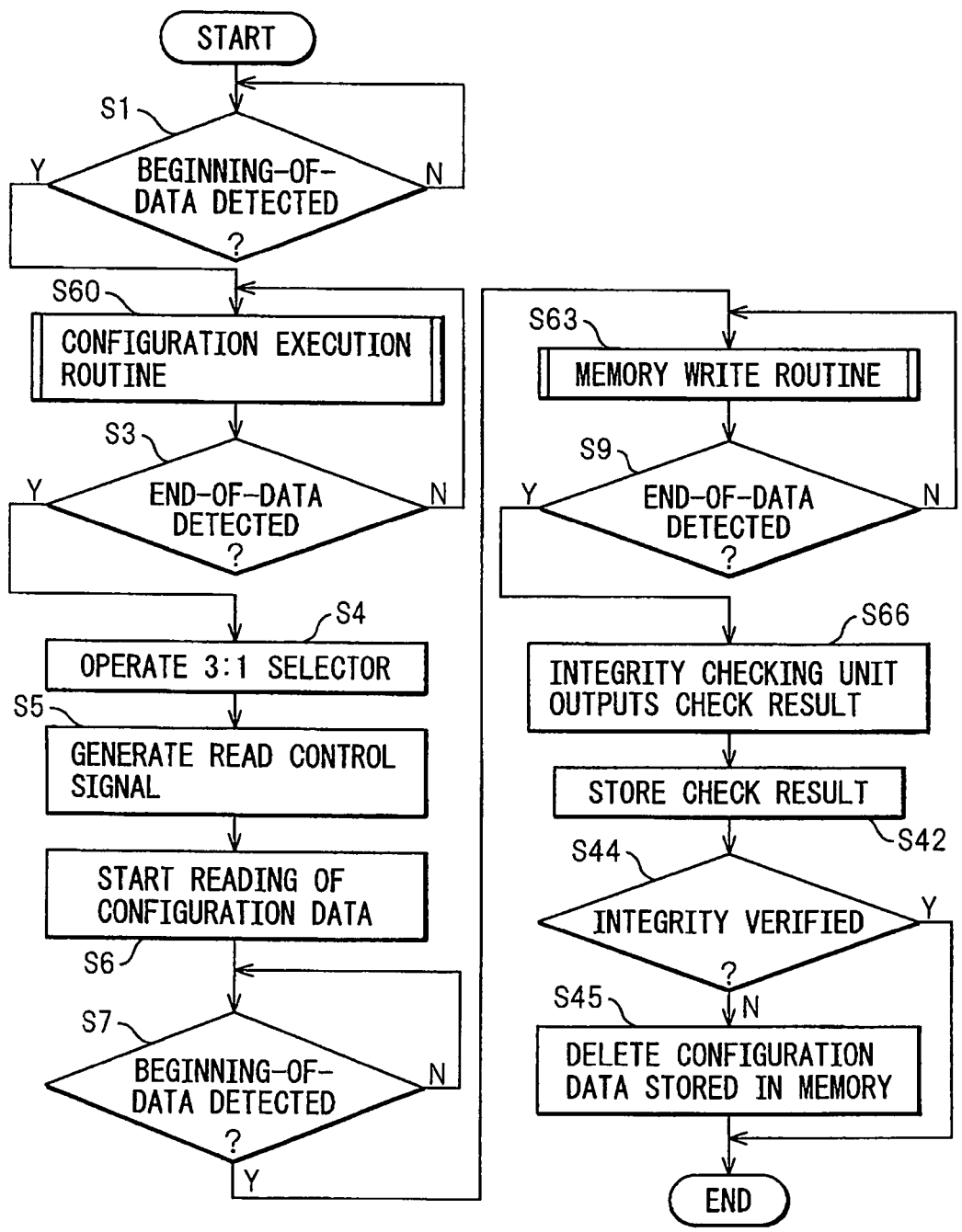
FIG. 22 is a flowchart illustrating a configuration method to be used by the FPGA configuration device of FIG. 22.
Figure 23:
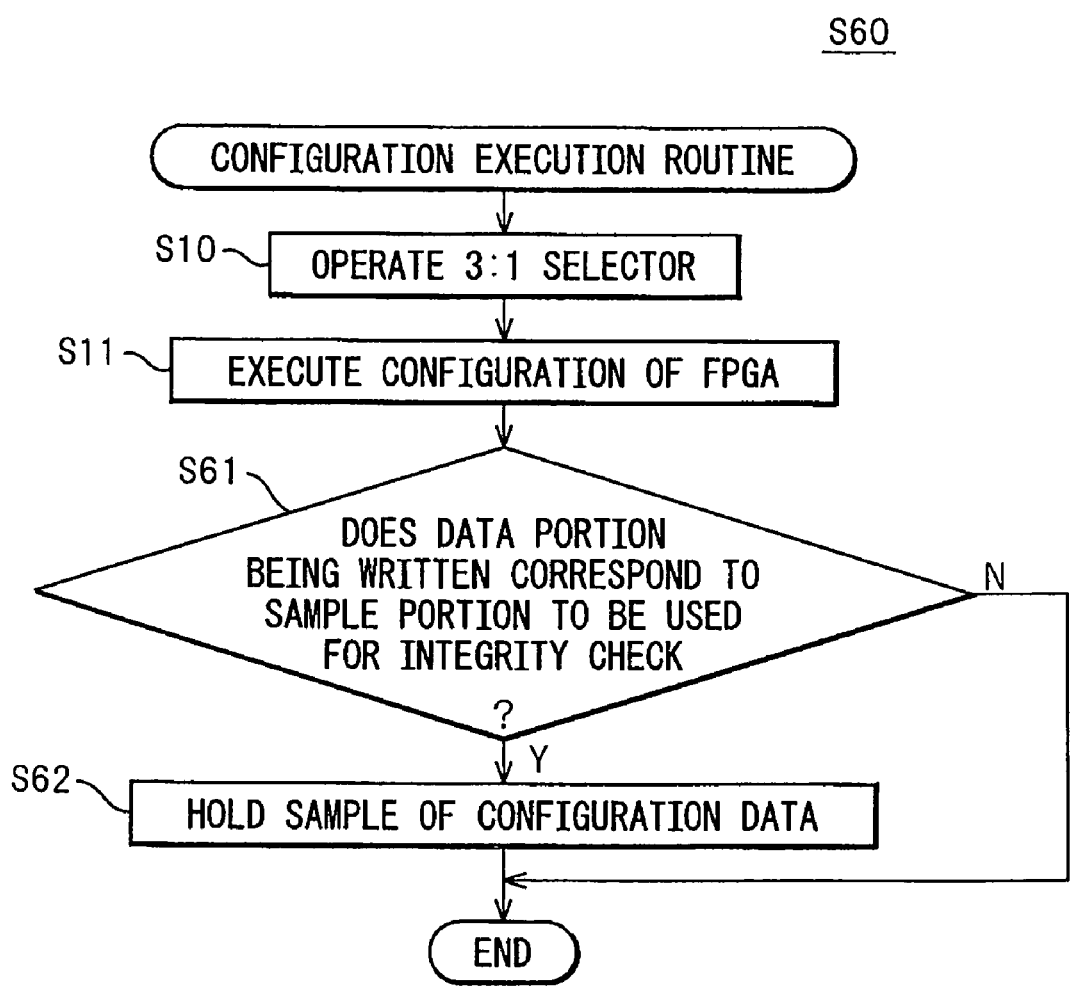
FIG. 23 is a flowchart of a configuration execution routine shown in FIG. 22.
Figure 24:
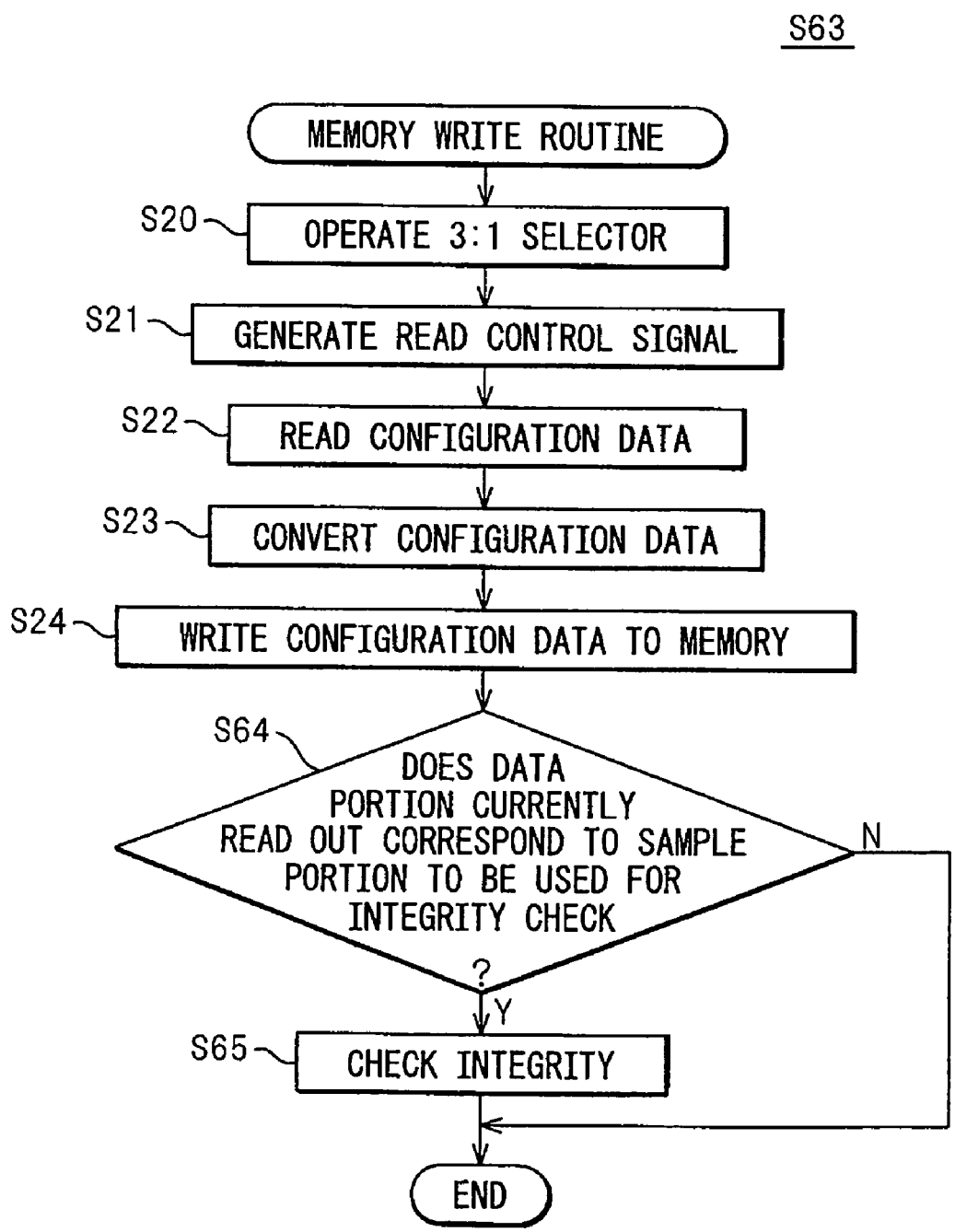
FIG. 24 is a flowchart of a memory write routine shown in FIG. 22.

FIG. 22 is a flowchart illustrating a configuration method to be used by the FPGA configuration device 3 of FIG. 21, FIG. 23 is a flowchart of a configuration execution routine S60 shown in FIG. 22, and FIG. 24 is a flowchart of a memory write routine S63 shown in FIG. 22. In step S1, as in step S1 shown in FIG. 4, the beginning of the configuration data being loaded from the data writer 100 is detected, and the phase of the configuration data is determined.

Figure 5:
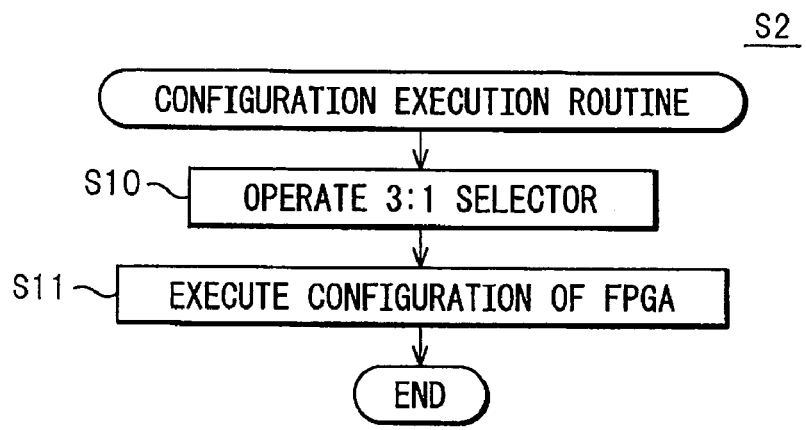
FIG. 5 is a flowchart of a configuration execution routine shown in FIG. 4.

After that, in steps S10 and S11 of FIG. 23, the 3:1 selector 18 is operated, and the configuration of the FPGA 2 is executed, as in steps S10 and S11 shown in FIG. 5. In step S61, based on the beginning of the configuration data detected by the beginning-of-write-data detection unit 10, the first sample extraction unit 36 determines whether the received portion of the configuration data is the portion to be extracted as a sample; if it is the portion to be extracted as a sample, the sample is extracted and held in the first sample holding unit 37 (step S62).

When, in step S3 shown in FIG. 22, the end-of-write-data detection unit 11 detects the end of the configuration data being loaded from the data writer 100, the process proceeds to step S4. In steps S4 to S7, the reading of the configuration data from the FPGA 2 is started, and the beginning of the configuration data is detected, as in steps S4 to S7 shown in FIG. 4. Thereafter, the process proceeds to the memory write routine S63 shown in FIG. 24.

In steps S20 to S24, as in steps S20 to S24 shown in FIG. 6, the configuration data is read out of the FPGA 2 and converted into a format suitable for writing to the memory 4, and the configuration data is stored in the memory 4. In step S64, based on the beginning of the configuration data detected by the beginning-of-read-data detection unit 14, the second sample extraction unit 38 determines whether the portion of the configuration data read out of the FPGA 2 is the portion to be extracted as a sample. If it is the portion to be extracted as a sample, the sample is extracted and sent to the integrity checking unit 31. In step S65, if the sample held in the first sample holding unit 37 matches the sample extracted by the second sample extraction unit 38, the integrity checking unit 31 determines that the integrity of the configuration data read out of the FPGA 2 has been verified, but if these samples do not match, the integrity checking unit 31 determines that the configuration data has failed the integrity check.

In step S66 of FIG. 22, the integrity checking unit 31 outputs the check result to the check result holding unit 32, and in step S42, the check result is held in the check result holding unit 32. In steps S44 and S45, if the configuration data fails the integrity check, processing is performed to invalidate the configuration data, as in steps S44 and S45 shown in FIG. 16.

In the configuration shown in FIG. 21, the first sample extraction unit 36 takes as inputs the detection signals from the beginning-of-write-data detection unit 10 and the end-of-write-data detection unit 11, but instead of the detection signals from the beginning-of-write-data detection unit 10 and the end-of-write-data detection unit 11, other signals may be input to the first sample extraction unit 36, as long as such other signals can be used to identify the phase and end of the configuration data being loaded from the data writer 100. For example, signals that can be used to identify the phase and end of the configuration data may be supplied from the configuration state control unit 12. This also applies to other embodiments described herein. Further, the detection signal from the end-of-write-data detection unit 11 is input to the first sample extraction unit 36, but if the data end position can be determined without having to detect the end of the configuration data, such as when the length of the configuration data is known in advance, the end-of-write-data detection unit 11 may be omitted. This also applies to other embodiments described herein.

The second sample extraction unit 38 takes as inputs the detection signals from the beginning-of-read-data detection unit 14 and the end-of-read-data detection unit 15, but instead of the detection signals from the beginning-of-read-data detection unit 14 and the end-of-read-data detection unit 15, other signals may be input to the second sample extraction unit 38, as long as such other signals can be used to identify the phase and end of the configuration data being read out of the FPGA 2. For example, signals that can be used to identify the phase and end of the configuration data may be supplied from the configuration state control unit 12. This also applies to other embodiments described herein. Further, the detection signal from the end-of-read-data detection unit 15 is input to the second sample extraction unit 38, but if the data end position can be determined without having to detect the end of the configuration data, such as when the length of the configuration data is known in advance, the end-of-read-data detection unit 15 may be omitted. This also applies to other embodiments described herein.

Figure 25:
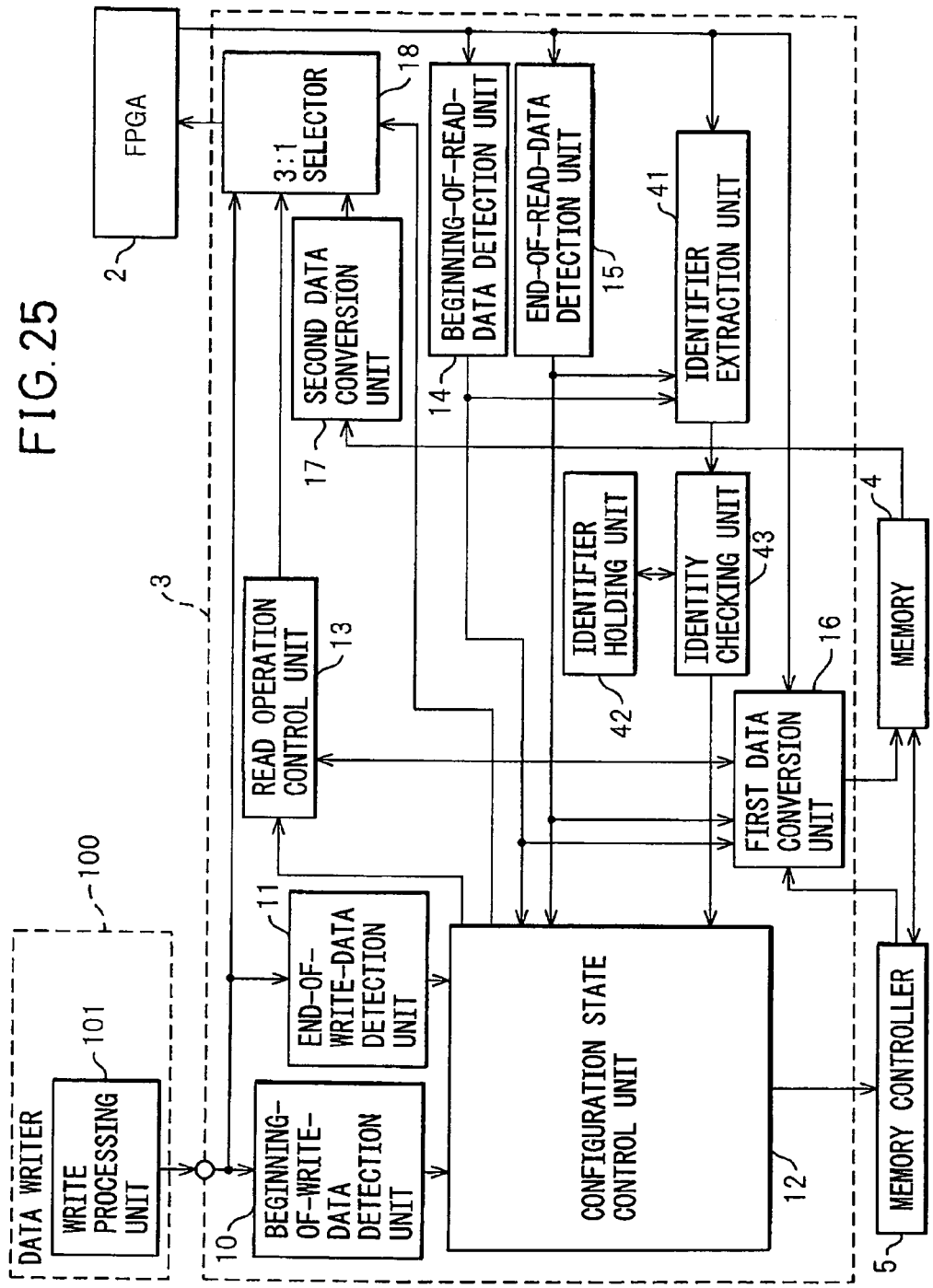
FIG. 25 is a block diagram schematically showing a sixth configuration example of the FPGA configuration device disclosed herein.

FIG. 25 is a block diagram schematically showing a sixth configuration example of the FPGA configuration device 3 disclosed herein. The FPGA configuration device 3 shown in FIG. 25 is similar in configuration to the FPGA configuration device 3 described with reference to FIG. 3, and the same component elements are designated by the same reference numerals and will not be described further herein. This configuration example includes an identifier extraction unit 41 which extracts, from the configuration data read out of the FPGA 2, identifier information for identifying the configuration data, such as version information contained in the configuration data, an identifier holding unit 42 which holds the identifier extracted by the identifier extraction unit 41, and an identity checking unit 43 which checks whether the currently readout configuration data and the configuration data stored in the memory 4 are identical with each other by comparing the identifier extracted by the identifier extraction unit 41 with the identifier previously held in the identifier holding unit 42. If the currently readout configuration data is identical with the configuration data stored in the memory 4, the configuration state control unit 12 aborts the operation for reading the configuration data from the FPGA 2. The identifier extraction unit 41 identifies, based on the detection results supplied from the beginning-of-read-data detection unit 14 and the end-of-read-data detection unit 15, the beginning and end of the configuration data being read out of the FPGA 2, and extracts the identifier information located at a designated position in the configuration data.

Figure 26:
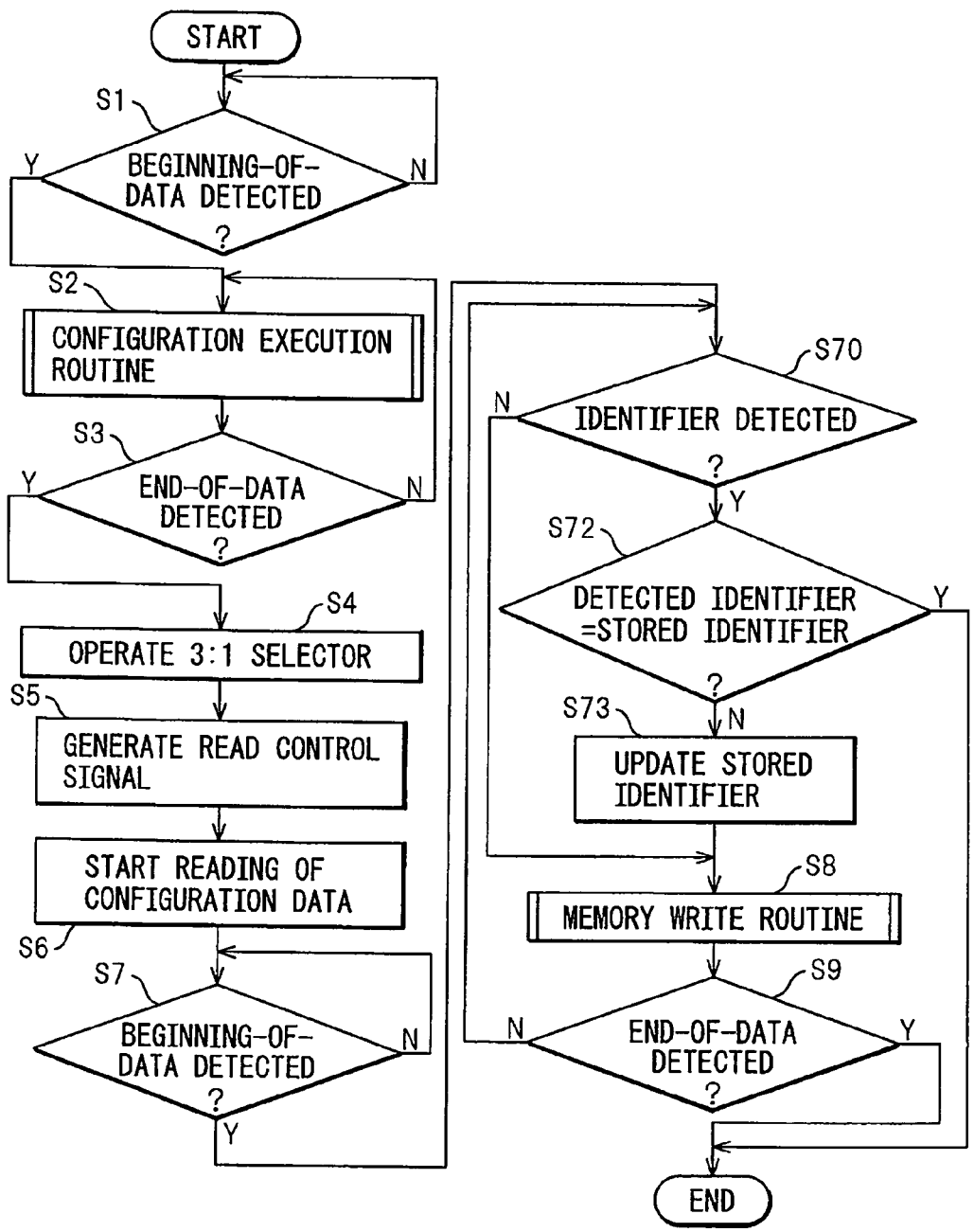
FIG. 26 is a flowchart illustrating a configuration method to be used by the FPGA configuration device of FIG. 25.

FIG. 26 is a flowchart illustrating a configuration method to be used by the FPGA configuration device 3 of FIG. 25. The process from step S1 to step S7 is the same as the process from step S1 to step S7 shown in FIG. 4, and therefore, will not be described further herein. In step S70, the identifier extraction unit 41 extracts the configuration data identifier information contained in the readout configuration data. If no identifier information is detected, the process jumps to step S8.

In step S72, the identity checking unit 43 compares the identifier extracted by the identifier extraction unit 41 from the configuration data currently read out of the FPGA 2 with the identifier extracted from the previously readout configuration data and currently held in the identifier holding unit 42, and outputs the result of the check to the configuration state control unit 12. If these identifiers match each other, it means that the currently readout configuration data is identical with the configuration data stored in the memory 4. Accordingly, the configuration state control unit 12 instructs the read operation control unit 13 to abort the generation of the configuration data read control signal. For example, the configuration state control unit 12 deasserts the read instruction signal being output to the read instruction receiver 20 shown in FIG. 7. Further, the configuration state control unit 12 instructs the memory controller 5 to abort the data writing.

On the other hand, if the identifiers do not match, the identity checking unit 43 in step S73 transfers the identifier currently extracted by the identifier extraction unit 41 into the identifier holding unit 42, and thus updates the identifier information stored in the identifier holding unit 42. The process from step S8 to step S9 is the same as the process from step S8 to step S9 described with reference to FIG. 4, and therefore, will not be described further herein.

Here, the identifier extraction unit 41 takes as inputs the detection signals from the beginning-of-read-data detection unit 14 and the end-of-read-data detection unit 15, but instead of the detection signals from the beginning-of-read-data detection unit 14 and the end-of-read-data detection unit 15, other signals may be input to the identifier extraction unit 41, as long as such other signals can be used to identify the phase and end of the configuration data being read out of the FPGA 2. For example, signals that can be used to identify the phase and end of the configuration data may be supplied from the configuration state control unit 12. This also applies to other embodiments described herein. Further, the detection signal from the end-of-read-data detection unit 15 is input to the identifier extraction unit 41, but if the data end position can be determined without having to detect the end of the configuration data, such as when the length of the configuration data is known in advance, the end-of-read-data detection unit 15 may be omitted. This also applies to other embodiments described herein.

Figure 27:
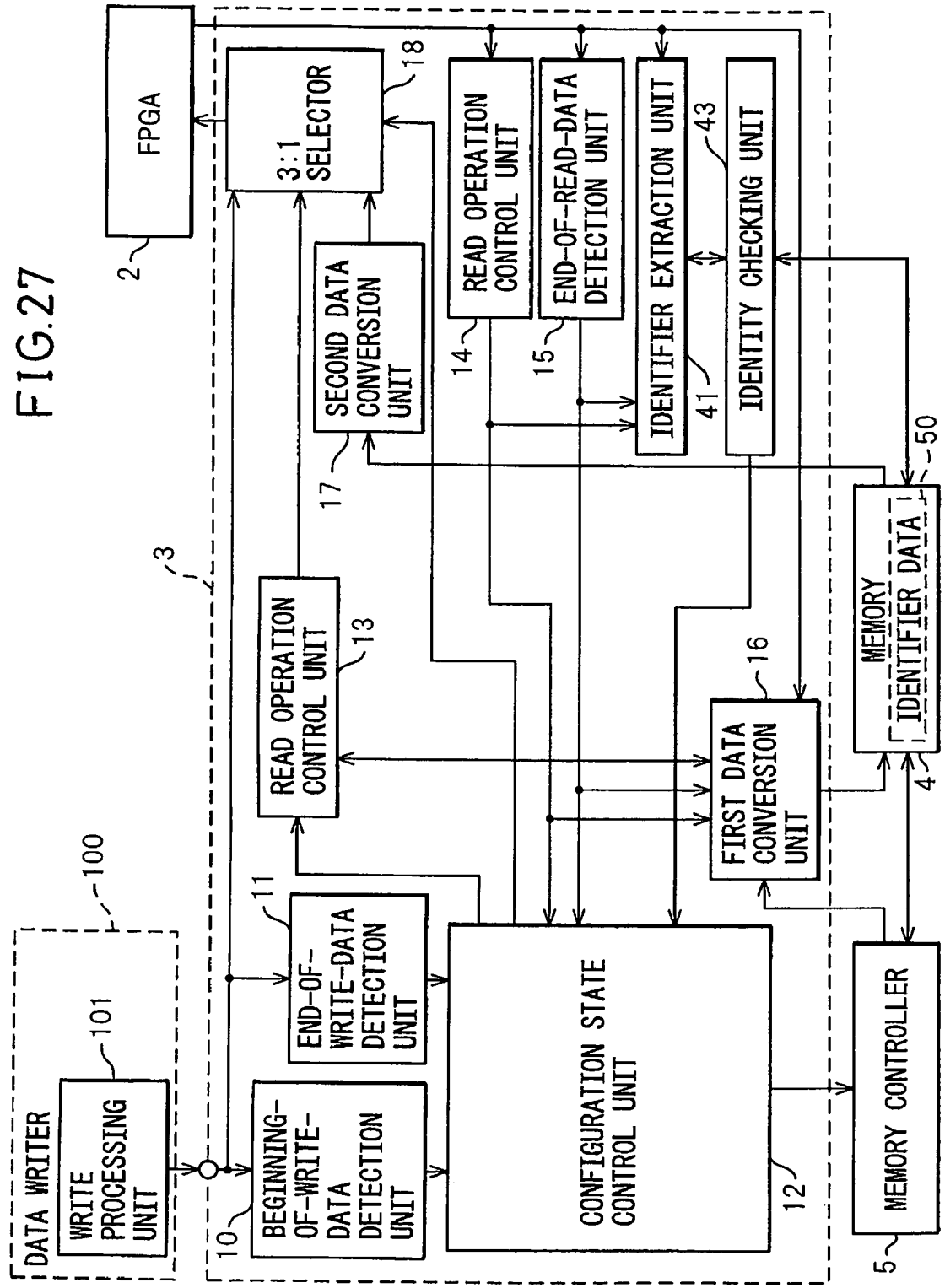
FIG. 27 is a block diagram schematically showing a seventh configuration example of the FPGA configuration device disclosed herein.

FIG. 27 is a block diagram schematically showing a seventh configuration example of the FPGA configuration device 3 disclosed herein. The FPGA configuration device 3 shown here is similar in configuration to the FPGA configuration device 3 described with reference to FIG. 25, and the same component elements are designated by the same reference numerals and will not be described further herein. In this configuration example, the identity checking unit 43 compares the identifier extracted by the identifier extraction unit 41 from the configuration data read out of the FPGA 2 with the identifier retrieved from the configuration data stored in the memory 4, and checks whether the configuration data read out of the FPGA 2 matches the identifier retrieved from the configuration data stored in the memory 4.

Figure 28:
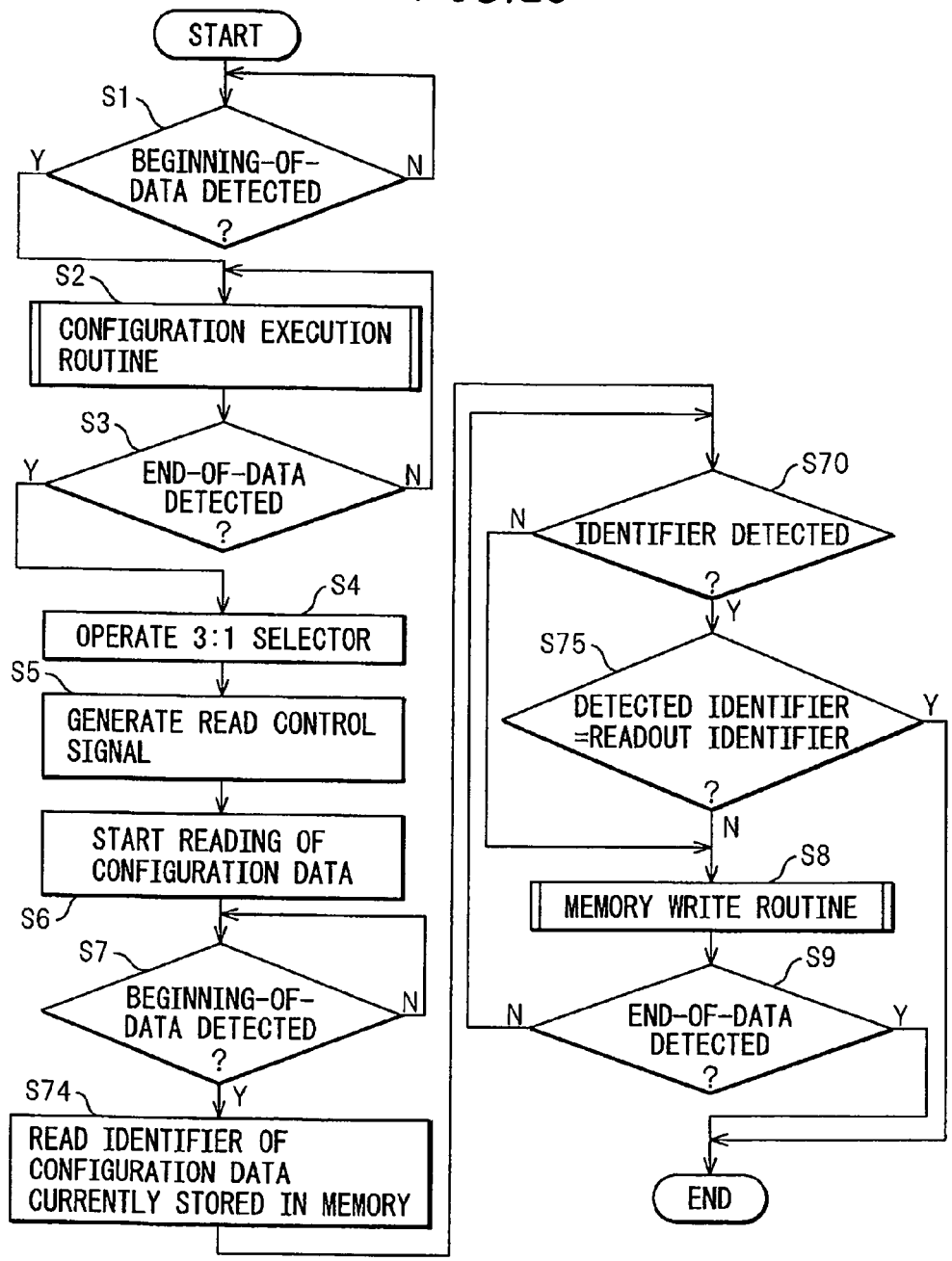
FIG. 28 is a flowchart illustrating a configuration method to be used by the FPGA configuration device of FIG. 27.

FIG. 28 is a flowchart illustrating a configuration method to be used by the FPGA configuration device 3 of FIG. 27. The process from step S1 to step S7 is the same as the process from step S1 to step S7 shown in FIG. 4, and therefore, will not be described further herein. In step S74, the identity checking unit 43 instructs the configuration state control unit 12 to read the identifier retrieved from the configuration data stored in the memory 4. The configuration state control unit 12 instructs the memory controller 5 to read the identifier from the configuration data stored in the memory 4.

In step S70, the identifier extraction unit 41 extracts the configuration data identifier information contained in the readout configuration data. If no identifier information is detected, the process jumps to step S8. In step S75, the identity checking unit 43 compares the identifier currently extracted by the identifier extraction unit 41 with the identifier retrieved from the memory 4, and outputs the result of the check to the configuration state control unit 12.

If these identifiers match each other, the configuration state control unit 12 instructs the read operation control unit 13 to abort the generation of the configuration data read control signal. Further, the configuration state control unit 12 instructs the memory controller 5 to abort the data writing. The process from step S8 to step S9 is the same as the process from step S8 to step S9 described with reference to FIG. 4, and therefore, will not be described further herein.

According to the device and method disclosed herein, since the data transfer speed at which the data is transferred to the memory need not necessarily be made faster than the data transfer speed at which the external data writer transfers the data for configuration of the FPGA, the earlier described constraints on the data transfer speed between the FPGA configuration device and the memory can be eliminated.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention(s) has(have) been described in detail, it should be understood that various changes, substitutions, and alterations could be made hereto without departing from the spirit and scope of the invention.

What is claimed is:

1. An FPGA configuration device, connected to an FPGA and a memory, for configuring said FPGA by using configuration data stored in said memory, comprising:
    a read operation control unit which performs control to read configuration data from said FPGA;
    a configuration data transfer unit which transfers said configuration data read out of said FPGA to said memory; and
    a write completion detection unit which detects completion of writing said configuration data to said FPGA,
    wherein reading out of said configuration data written to said FPGA and writing of said configuration data to said memory is initiated when the writing of said configuration data to said FPGA is completed.

2. A circuit board having an FPGA configuration device as claimed in claim 1.

3. An electronic device having an FPGA configuration device as claimed in claim 1, wherein an FPGA that controls operation of said electronic device is configured by said FPGA configuration device.

4. An FPGA configuration device as claimed in claim 1,
    wherein said configuration device is adapted to be connected to a data writer which writes configuration data to said FPGA and a memory controller which performs control for writing to said memory, and
    wherein said write completion detection unit detects completion of the writing of said configuration data from said data writer to said FPGA, and
    wherein said configuration device further comprises a configuration state control unit which, when the writing of said configuration data is completed, causes said read operation control unit to initiate control to read out the configuration data written to said FPGA and causes said memory controller to initiate processing for writing to said memory said configuration data transferred from said configuration data transfer unit.

5. An FPGA configuration device as claimed in claim 4, further comprising an identity checking unit which checks whether the configuration data read out of said FPGA and the configuration data stored in said memory are identical with each other.

6. An FPGA configuration device as claimed in claim 5, wherein said identity checking unit reads an identifier from the configuration data held in said memory, and thereby checks whether said configuration data is identical with the configuration data read out of said FPGA.

7. An FPGA configuration device as claimed in claim 4, further comprising an integrity checking unit which checks integrity of said configuration data read out of said FPGA.

8. An FPGA configuration device as claimed in claim 7, wherein said configuration state control unit invalidates the configuration data stored in said memory, depending on a result from the integrity check performed by said integrity checking unit.

9. An FPGA configuration device as claimed in claim 7, further comprising an error checking code calculation unit which calculates an error checking code for said configuration data read out of said FPGA, and wherein
    said integrity checking unit checks said integrity by comparing said calculated error checking code with an error checking code included in advance in said configuration data.

10. An FPGA configuration device as claimed in claim 7, further comprising:
    a first error checking code calculation unit which calculates an error checking code for the configuration data that said data writer writes to said FPGA; and
    a second error checking code calculation unit which calculates an error checking code for the configuration data read out of said FPGA, and wherein
    said integrity checking unit checks said integrity by a comparison between the error checking codes calculated by said first and second error checking code calculation units.

11. An FPGA configuration device as claimed in claim 7, further comprising:
    a first sample extraction unit which extracts a portion of the configuration data that said data writer is writing to said FPGA; and
    a second sample extraction unit which extracts a portion of the configuration data being read out of said FPGA, and wherein
    said integrity checking unit checks said integrity by a comparison between the data extracted by said first and second sample extraction units.

12. An FPGA configuration method for configuring an FPGA by loading configuration data from a designated memory into said FPGA, comprising:
    detecting completion of writing the configuration data to said FPGA;
    initiating reading of the configuration data from said FPGA and storing said configuration data in said designated memory, when the writing of the configuration data to said FPGA is completed; and
    loading the configuration data stored in said designated memory into said FPGA and thereby configuring said FPGA in the same configuration state as said prescribed configuration state.

* * * * *